US012628445B2

(12) United States Patent
Osawa et al.

(10) Patent No.: US 12,628,445 B2
(45) Date of Patent: May 12, 2026

(54) RADIATION DETECTOR AND RADIATION IMAGING SYSTEM

(71) Applicant: CANON KABUSHIKI KAISHA, Tokyo (JP)

(72) Inventors: Kazutaka Osawa, Kanagawa (JP); Takanori Watanabe, Kanagawa (JP); Tomona Yamaguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 322 days.

(21) Appl. No.: 18/196,775

(22) Filed: May 12, 2023

(65) Prior Publication Data

US 2023/0378228 A1      Nov. 23, 2023

(30) Foreign Application Priority Data

May 18, 2022      (JP) ................................. 2022-081757
Feb. 6, 2023      (JP) ................................. 2023-016012

(51) Int. Cl.
*H10F 39/18*          (2025.01)
*H10F 39/00*          (2025.01)

(52) U.S. Cl.
CPC ....... *H10F 39/1892* (2025.01); *H10F 39/802* (2025.01); *H10F 39/80377* (2025.01); *H10F 39/811* (2025.01)

(58) Field of Classification Search
CPC .............. H10F 39/1892; H10F 39/802; H10F 39/80377; H10F 39/811
See application file for complete search history.

(56) References Cited

U.S. PATENT DOCUMENTS

| | | |
|---|---|---|
| 11,011,558 B2 | 5/2021 | Sakaguchi et al. |
| 2019/0140002 A1 | 5/2019 | Sakaguchi et al. |

FOREIGN PATENT DOCUMENTS

| | | | |
|---|---|---|---|
| JP | 2019-87640 A | 6/2019 | |
| WO | WO-2020262320 A1 * | 12/2020 | ............. H04N 25/79 |

OTHER PUBLICATIONS

English translation of WO 2020/262320 A1 (Year: 2020).*
Co-pending U.S. Appl. No. 18/195,652, filed May 10, 2023.

* cited by examiner

*Primary Examiner* — Mark R Gaworecki
(74) *Attorney, Agent, or Firm* — VENABLE LLP

(57) ABSTRACT

A radiation detector comprising: a pixel array in which pixels each having a radiation detection element configured to convert radiation into charges and an amplification transistor configured to amplify a signal from the radiation detection element and output the amplified signal are arrayed in a matrix shape; and signal wiring provided for each pixel column, wherein the signal wiring does not overlap an active layer, in which the amplification transistor is arranged, in a plan view.

13 Claims, 17 Drawing Sheets

ACTIVE REGION
POLYSILICON LAYER
FIRST WIRING LAYER
SECOND WIRING LAYER
CONTACT PLUG
VIA PLUG

ACTIVE REGION

POLYSILICON LAYER

FIRST WIRING LAYER

SECOND WIRING LAYER

CONTACT PLUG

VIA PLUG

ACTIVE REGION
POLYSILICON LAYER
FIRST WIRING LAYER
SECOND WIRING LAYER
CONTACT PLUG
VIA PLUG

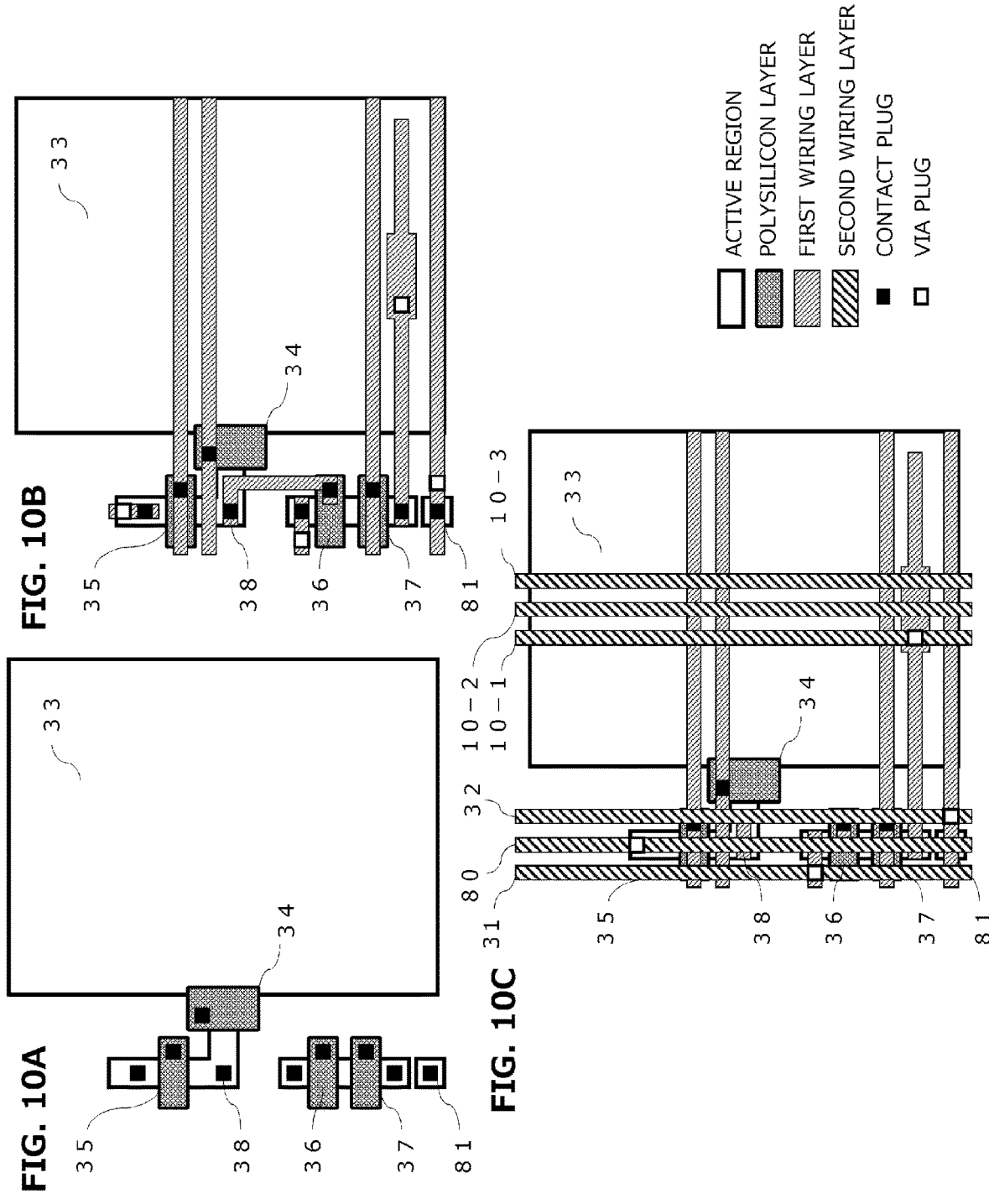

ACTIVE REGION
POLYSILICON LAYER
FIRST WIRING LAYER
SECOND WIRING LAYER
CONTACT PLUG
VIA PLUG

| | ACTIVE REGION |
|---|---|
| | POLYSILICON LAYER |
| | FIRST WIRING LAYER |
| | SECOND WIRING LAYER |
| ■ | CONTACT PLUG |
| □ | VIA PLUG |

ACTIVE REGION

POLYSILICON
LAYER

FIRST WIRING
LAYER

SECOND WIRING
LAYER

■ CONTACT PLUG

□ VIA PLUG

ACTIVE REGION

POLYSILICON LAYER

FIRST WIRING LAYER

SECOND WIRING LAYER

■ CONTACT PLUG

□ VIA PLUG

RADIATION DETECTOR AND RADIATION IMAGING SYSTEM

BACKGROUND OF THE INVENTION

Field of the Invention

The present invention relates to a radiation detector and a radiation imaging system.

Description of the Related Art

Japanese Patent Application Laid-open No. 2019-87640 discloses a method for improving accuracy in detecting energy rays by defining the thickness of the detection region of an energy ray detector (radiation detector).

Degradation possibly occurs when radiation is incident on the radiation detector.

SUMMARY OF THE INVENTION

The present invention has an object of providing a radiation detector having enhanced detection sensitivity.

An aspect of the disclosure is a radiation detector comprising: a pixel array in which pixels each having a radiation detection element configured to convert radiation into charges and an amplification transistor configured to amplify a signal from the radiation detection element and output the amplified signal are arrayed in a matrix shape; and signal wiring provided for each pixel column, wherein the signal wiring does not overlap an active layer, in which the amplification transistor is arranged, in a plan view.

According to the present invention, it is possible to provide a radiation detector having enhanced radiation resistance.

Further features of the present invention will become apparent from the following description of exemplary embodiments with reference to the attached drawings.

BRIEF DESCRIPTION OF THE DRAWINGS

FIGS. 10A to 10C are top surface diagrams of a pixel according to a sixth embodiment;

DESCRIPTION OF THE EMBODIMENTS

Hereinafter, embodiments of the present invention will be described in detail with reference to the accompanying drawings. Note that the following embodiments will show only specific examples of the technical thoughts of the present invention and will not intend to limit the present invention. The embodiments will describe plurality of characteristics. However, all the plurality of characteristics are not necessary for the invention, and the plurality of characteristics may be arbitrarily combined together.

The sizes or positional relationships of members shown in the respective drawings will be exaggerated according to circumstances to make descriptions definite. Hereinafter, the same configurations will be denoted by the same symbols, and their descriptions will be omitted in some cases.

The degradation of a radiation detector is understood as follows.

When radiation is incident on the radiation detector, charges generated in an insulating layer are retained in the insulating layer. The charges retained in the insulating layer fluctuate the potential of the channel of an in-pixel transistor and shift a threshold. Therefore, the operating point of the in-pixel transistor is fluctuated. Further, the charges retained in the insulating layer change the width of the depletion layer of a PN junction part formed as the source, drain, or the like of the in-pixel transistor and fluctuate parasitic capacitance. Moreover, the charges retained in the insulating layer has an influence on the potential of a detection diode and increases a dark current. Alternatively, the operating point of a pixel circuit fluctuates when the charges retained in the insulating layer increase the dark current of a floating node.

These factors due to the charges retained in the insulating layer have an influence on a sensor output and disables the output of a desired signal.

Since the amount of the charges retained in the insulating layer increases according to the irradiation amount of radiation, a pixel output deviates from a desired output according to the irradiation amount. Therefore, this phenomenon will be hereinafter called the degradation of a sensor due to radiation.

First Embodiment (Configuration of Imaging Device)

Figure 1:
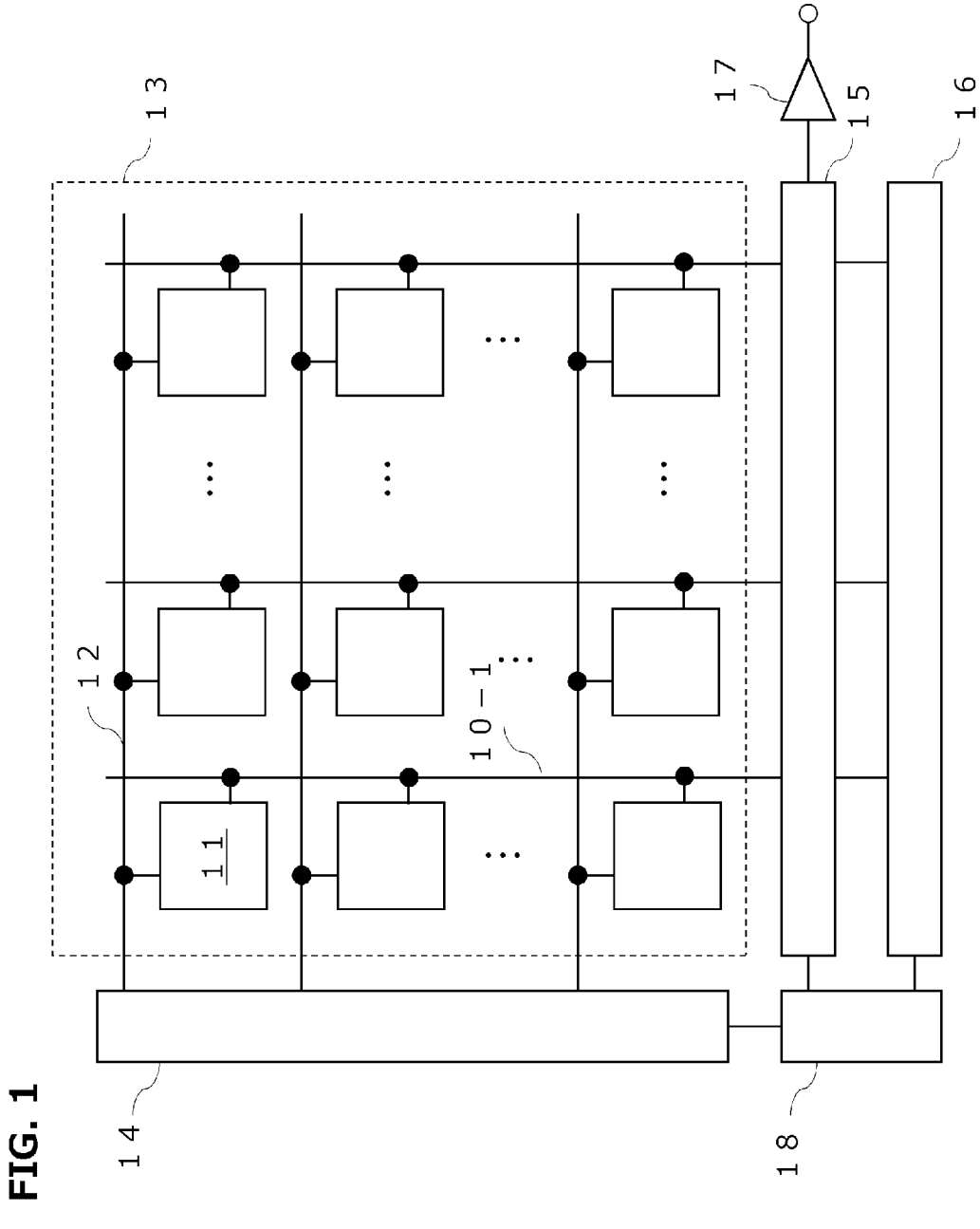
FIG. 1 is a diagram showing the configuration of an imaging device according to a first embodiment.

FIG. 1 is a diagram showing the configuration of an imaging device (radiation detector) according to the present embodiment. The imaging device according to the present embodiment has signal wiring 10-1 and pixels 11. The pixels 11 are arrayed in a matrix shape over a plurality of rows and a plurality of columns in a pixel array 13. One signal wiring 10-1 is arranged with respect to one pixel column in which the pixels 11 are arranged. Further, the imaging device has a vertical scanning circuit 14. The pixels 11 of one row arranged over the plurality of columns are connected to the vertical scanning circuit 14 via one control line 12. The vertical scanning circuit 14 controls the accumulation periods of the pixels 11.

The imaging device has a column circuit unit 15, a horizontal scanning circuit 16, and an output circuit 17. The column circuit unit 15 includes a plurality of column circuits. One of the plurality of column circuits is arranged corresponding to the signal wiring 10-1. Each of the plurality of column circuits processes signals output from the pixels 11 to the signal wiring 10-1 and outputs the processed signals to the output circuit 17. An example of this processing is AD conversion, amplification, or the like.

The horizontal scanning circuit 16 sequentially selects the plurality of column circuits included in the column circuit unit 15. Thus, a signal retained by each of the plurality of column circuits is sequentially output to the output circuit 17. The output circuit 17 outputs the signals to the outside of the imaging device. The signals output from the output circuit 17 are signals output from the imaging device.

The imaging device further has a control circuit (control unit) 18. The control circuit 18 is connected to each of the vertical scanning circuit 14, the column circuit unit 15, and the horizontal scanning circuit 16 via a driving line that supplies a driving signal, and controls these circuits.
(Circuit Configuration of Pixels)

Figure 2:
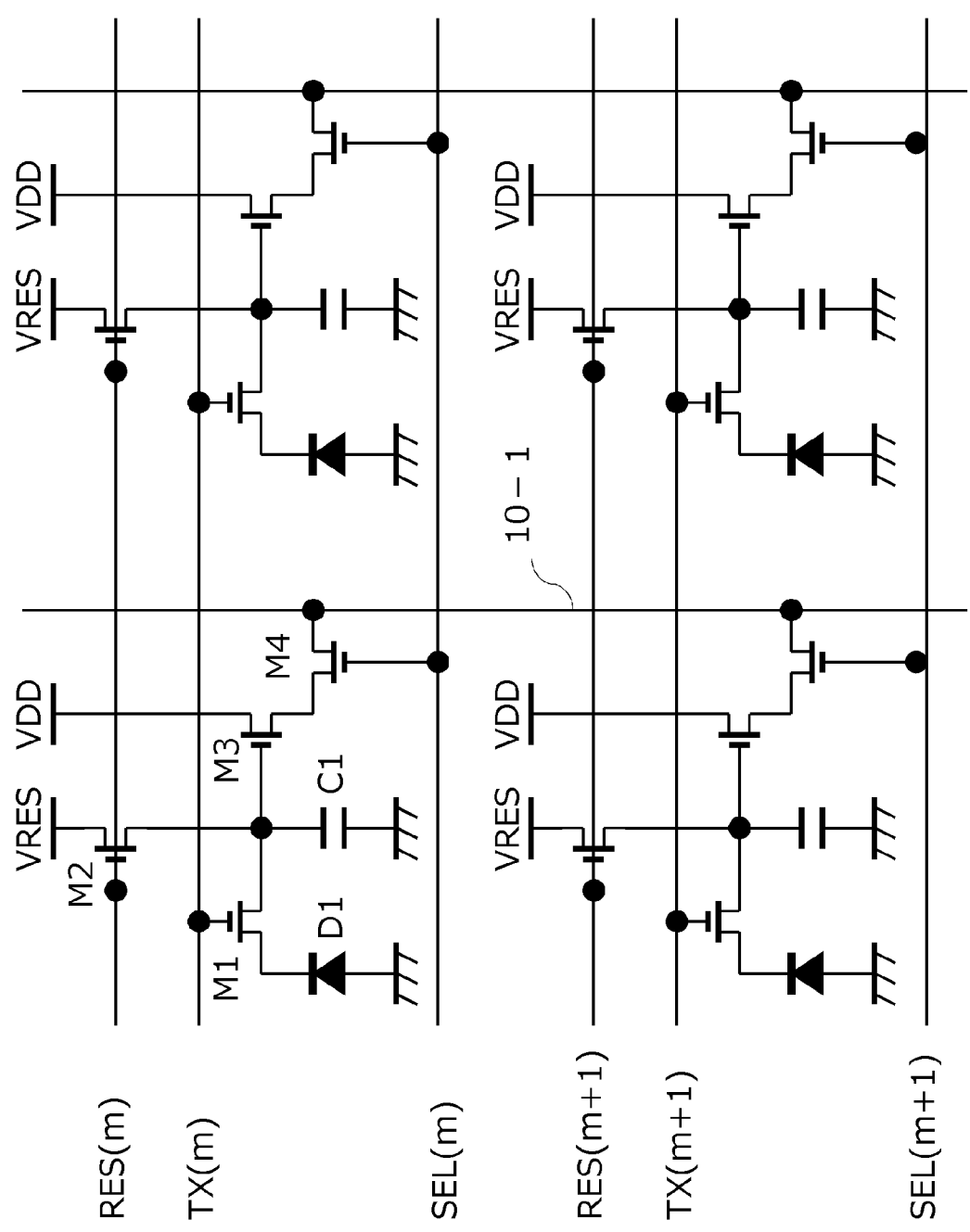
FIG. 2 is an equivalent circuit diagram of pixels according to the first embodiment.

FIG. 2 is a circuit diagram showing the circuits of two rows and two columns among the pixels 11 shown in FIG. 1. Hereinafter, it is assumed that charges accumulated by detection diodes D1 serving as radiation detection elements are electrons. Accordingly, all transistors included in the pixels 11 are N-type transistors in the present embodiment. Meanwhile, the charges accumulated by the detection diodes may be holes. In this case, the transistors of the pixels 11 may be P-type transistors. That is, the definition of conductive types that will be used in the following descriptions may be changed according to the polarities of charges handled as signals.

The pixels 11 have the detection diode D1 serving as a radiation detection element (photoelectric conversion unit), a transfer transistor M1, a charge retention unit C1, a reset transistor M2, an amplification transistor M3, and a selection transistor M4.

The detection diode D1 converts radiation into charges. The radiation detected by the detection diode D1 may be ionizing radiation such as X-rays and gamma rays or may be particle radiation such as alpha rays, beta rays, electron rays, neutron rays, proton rays, heavy ion rays, and meson rays. The detection diode D1 according to the present embodiment detects electron rays. The detection diode D1 has, for example, a single crystal semiconductor layer made of silicon or germanium but may have a polycrystalline semiconductor layer.

The transfer transistor M1 is provided on the electric path between the detection diode D1 and nodes to which the charge retention unit C1, the reset transistor M2, and the amplification transistor M3 are connected. A power supply voltage is given to each of the drains of the reset transistor M2 and the amplification transistor M3. The selection transistor M4 is provided on the electric path between the amplification transistor M3 and the signal wiring 10-1. The amplification transistor M3 is electrically connected to the signal wiring 10-1 via the selection transistor M4. The charge retention unit C1 includes a floating diffusion unit (floating diffusion capacitance) provided inside a semiconductor substrate and the parasitic capacitance of an electric path from the transfer transistor M1 to the amplification transistor M3 via the floating diffusion unit.

Each of a signal RES, a signal TX, and a signal SEL is a signal supplied via the control lines 12 from the vertical scanning circuit 14 shown in FIG. 1. In FIG. 2, the ends of the respective signals indicate pixel rows to which the signals are supplied. For example, a signal RES(m) indicates the signal RES that is supplied to the pixels of the m-th row.

A current source (not shown) is connected to the signal wiring 10-1. When the signal SEL(m) turns to an active level, the selection transistors M4 of the pixels 11 of the m-th row are turned on. Thus, a current is supplied from the current source to the amplification transistors M3 of the pixels 11 of the m-th row. In each of the pixels 11 of the m-th row, a source follower circuit is formed by a power supply voltage VDD, the amplification transistor M3, and the current source (not shown) connected to the signal wiring 10-1. By the formation of the source follower circuit, the amplification transistor M3 outputs a signal based on the potential of the charge retention unit C1 to the signal wiring 10-1 via the transistor M4.

Further, when a signal SEL(m+1) turns to an active level, the selection transistors M4 of the pixels 11 of the m+1-th row are turned on. Thus, a current is supplied from the current source to the amplification transistors M3 of the m+1-th row. In each of the pixels 11 of the m+1-th row, a source-follower circuit is formed by the power supply voltage VDD, the amplification transistor M3, and the current source (not shown) connected to the signal wiring 10-1. By the formation of the source follower circuit, the amplification transistor M3 outputs a signal based on the potential of the charge retention unit C1 to the signal wiring 10-1 via the transistor M4.
(Plan View of Pixel)

Figure 3:
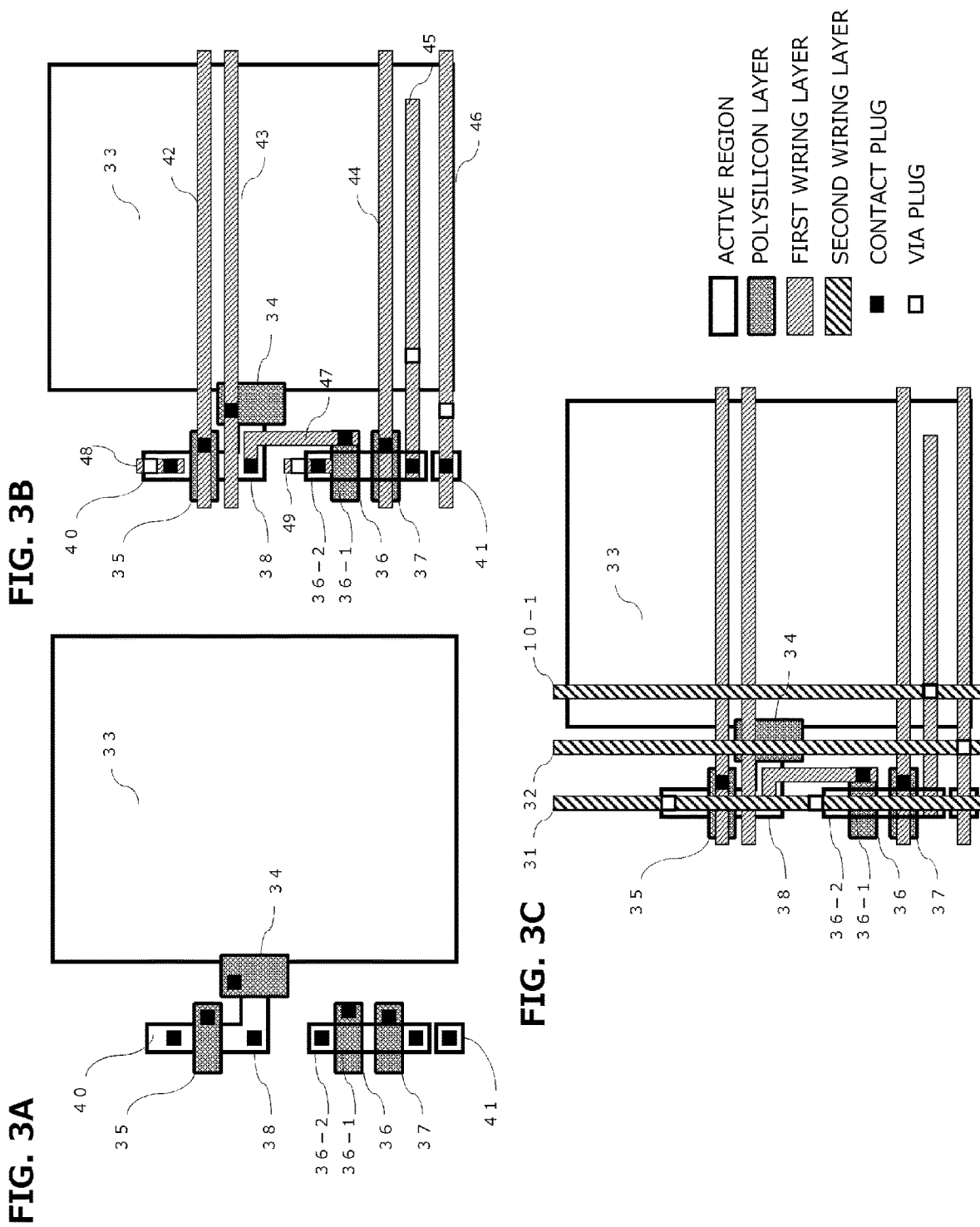
FIGS. 3A to 3C are top surface diagrams of a pixel according to the first embodiment.

FIGS. 3A to 3C are schematic diagrams for describing the layout of the pixels 11 shown in FIG. 1. In FIGS. 3A to 3C, legends show an active region, a polysilicon layer, a first wiring layer, a second wiring layer, a contact plug, and a via plug. The active region is the surface of a semiconductor substrate and is a portion at which an element such as a transistor is formed. A portion other than the active region in the surface of the semiconductor substrate can be an element isolation region. The element isolation region may have a structure including an insulator such as an STI (Shallow Trench Isolation) or a PN isolation structure using the conductivity type of a semiconductor. The polysilicon layer can be formed on the surface of the semiconductor substrate. The polysilicon layer constitutes, for example, the gate electrode of a transistor. The polysilicon layer is not limited to polysilicon but may be another metal. The first wiring layer and the second wiring layer are made of electric conductors and arranged on the surface of the semiconductor substrate. The first wiring layer and the second wiring layer are arranged in this order from the surface of the semiconductor substrate. An interlayer insulating film is arranged between the semiconductor substrate and the first wiring layer, and an interlayer insulating film is arranged between the first wiring layer and the second wiring layer. The contact plug is made of an electric conductor and electrically connects the semiconductor substrate and the first wiring layer and connects the polysilicon layer and the first wiring layer. The via plug is made of an electric conductor and electrically connects the first wiring layer and the second wiring layer. The structure of the wiring is not limited to this, but a third wiring layer may be arranged between the first wiring layer and the second wiring layer.

FIG. 3A is a top surface schematic diagram showing the active regions, the polysilicon layers, and the contact plugs. FIG. 3B is a top surface schematic diagram showing a state in which the first wiring layers and the via plugs are added to the structure shown in FIG. 3A. The contact plugs are positioned between the semiconductor substrate and the first wiring layers, but the contact plugs are drawn on the first wiring layers in FIG. 3B. This aims to facilitate the understanding of the positions of the contact plugs. FIG. 3C is a top surface schematic diagram showing a state in which the second wiring layers are added to the structure shown in FIG. 3B. In FIG. 3C as well, the via plugs are drawn on the second wiring layers to facilitate the understanding of the via plugs like the contact plugs shown in FIG. 3B. Note that the contact plugs and the via plugs are similarly drawn in the following figures.

In FIG. 3A, an active region includes a region 33, a gate electrode 34, a charge retention unit 38, a gate electrode 35, and a region 40. The region 33 is a region in which a detection diode D1 is arranged. A transfer transistor M1 includes the gate electrode 34, the region 33, and the charge retention unit 38. The charge retention unit 38 is the charge retention unit C1 shown in FIG. 2. The reset transistor M2 includes the charge retention unit 38, the gate electrode 35, and the region 40. Another active region includes an amplification transistor M3 and a selection transistor M4 and includes a gate electrode 36 of the amplification transistor M3 and a gate electrode 37 of the selection transistor M4. A region 41 is a region used to supply a potential to a well. The well is a semiconductor region in which respective elements are provided. For example, signal charges can be electrons, transistors can be N-type transistors, and the well can be a P-type semiconductor region.

A detection diode region is defined as an active layer in the present embodiment but may be defined as a semiconductor region having the same conductivity type as that of the well of a transistor using PN isolation.

As shown in FIG. 3B, the first wiring layers include a plurality of wiring lines. Wiring 42 supplies a control signal RES to the gate electrode 35 of the reset transistor M2. Wiring 43 supplies a control signal TX to the gate electrode 34 of the transfer transistor M1. Wiring 44 supplies a control signal SEL to the gate electrode 37 of the selection transistor M4. Wiring 45 is a signal output line that electrically connects signal wiring to the source/drain region of the selection transistor M4. Wiring 46 is wiring used to supply a voltage to a well. For example, when signal charges are electrons, the voltage supplied by the wiring 46 can be a ground (GND). Wiring 47 is wiring used to electrically connect the charge retention unit 38 and the gate electrode 36 of the amplification transistor M3. The capacitance component of the charge retention unit C1 includes the wiring 47, the charge retention unit 38, and the gate electrode 36. The wiring 48 is wiring used to supply a voltage to the region 40. For example, when signal charges are electrons, the voltage supplied by the wiring 48 can be a power supply voltage VDD. Wiring 49 is wiring used to supply a voltage to a region 36-2. For example, when signal charges are electrons, the voltage supplied by the wiring 49 can be the power supply voltage VDD. Here, wiring 42 to wiring 46 are global wiring lines provided common to a plurality of pixels. The long sides of the wiring 42 to wiring 46 are along an X-direction and parallel to each other.

As shown in FIG. 3C, the second wiring layers include a plurality of wiring lines. Power supply wiring 31 is electrically connected to the source/drain region of the amplification transistor M3 via the via plugs, the wiring 48, and the contact plugs. By the power supply wiring 31, a power supply voltage is supplied to the source/drain region of the amplification transistor M3. Power supply wiring 32 is electrically connected to the region 41 via the via plugs, the wiring 46, and the contact plugs. By the power supply wiring 32, the GND is supplied to the region 41. The signal wiring 10-1 is a vertical output line. The signal wiring 10-1 is electrically connected to the source/drain region of the selection transistor M4 via the via plugs, the wiring 45, and the contact plugs. By the signal wiring 10-1, a pixel signal is output from the selection transistor M4. As described above, the wiring 31 that supplies a power supply voltage to the amplification transistor M3, the power supply wiring 32 that supplies a potential to a well, and the signal wiring 10-1 are formed in the same layer. The long sides of these wiring lines 31, 32, and 10-1 are along a Y-direction and parallel to each other.

Hereinafter, the mechanism of degradation due to radiation found out by the present inventors will be described.

It has been known that charges generated in an insulating layer are retained in the insulating layer in a radiation detector when radiation is incident on the radiation detector. Since the charges retained in the insulating layer fluctuate the potential of the channel of a pixel driving transistor and shift a threshold, the operating point of the pixel driving transistor fluctuates. Further, since the charges retained in the insulating layer change the width of the depletion layer of a PN junction part formed as the source, drain, or the like of the pixel driving transistor, parasitic capacitance fluctuates. Moreover, the charges retained in the insulating layer have an influence on the potential of a detection diode, and a dark current increases. The increased dark current fluctuates the potential of the charge retention unit. By these operations, the charges retained in the insulating layer have an influence on a sensor output and disable the output of a desired signal. Since the retained charges increase according to an absorbed dose, a pixel output deviates from a desired output according to an irradiation amount. Therefore, this phenomenon appears as the degradation of a sensor due to radiation.

According to the findings by the present inventors, the amount of charges retained in an insulating layer by the irradiation of radiation depends on the electric field of the insulating layer during the irradiation of the radiation. Further, the degree of degradation in characteristics during the operation of a sensor depends on an electric field around the retained charges. The influence of the retained charges increases when the electric field is large. As a result, the degradation resistance of a detector reduces.

In view of the above, the present inventors have paid attention to the layout relationship between the signal wiring 10-1 and the active layer of the amplification transistor M3 and have found out the fact that it is effective to arrange the signal wiring 10-1 and the active layer of the amplification transistor M3 so as not to overlap each other.

For example, the distance between the active layer of the amplification transistor M3 and the signal wiring 10-1 will be discussed about a case in which the film thickness between wiring layers is several hundred nanometers long and a pixel pitch is about several micrometers long. In comparison with a case in which the signal wiring 10-1 is formed so as to overlap the active layer of the amplification transistor M3 in a plan view, the distance can be increased by, for example, about 10 times when the signal wiring 10-1 is formed at the end of a pixel to be distant from the active layer of the amplification transistor M3. Therefore, the electric field between the active layer of the amplification transistor M3 and the signal wiring 10-1 is reduced by one digit. As a result, the degradation resistance of a detector to radiation is improved by at least one digit. As described above, the electric field between the active layer of the amplification transistor M3 and the signal wiring 10-1 may be remarkably reduced according to the present embodiment. Therefore, the degradation resistance of a detector to the irradiation may be improved. Note that the active layer of a transistor can be regarded as the active layer in which the transistor is arranged.

In addition to the above charges retained in an insulating film, an increase in an interface level due to a total dose effect or a displacement damage dose effect is also one of reasons for the degradation of a sensor due to the irradiation of radiation.

According to the findings by the present inventors, the amount of an increase in an interface level due to the irradiation of radiation depends on an electric field around the interface during the irradiation. Since the increase in the interface level is suppressed when the electric field around the interface is small, the degradation resistance of a sensor may be improved.

In a configuration in which signal wiring is formed at the upper part of the active layer of a transistor, an electric field around the active layer of the transistor easily fluctuates according to the potential of the signal wiring that changes according to a detected radiation dose. Since the amount of an increase in an interface level depends on an electric field around an interface, the degradation of a pixel changes according to the potential of signal wiring in the above configuration. That is, the magnitude of the degradation of respective pixel rows changes according to the output image pattern of a sensor, and a phenomenon such as image persistence occurs.

The present embodiment is characterized in that the signal wiring 10-1 is not formed at the upper part of the active layer of a transistor, that is, the signal wiring 10-1 and the active layer of the transistor do not overlap each other in a plan view as shown in FIG. 3C. Note that the above image persistence may be reduced since a fluctuation in a surrounding electric field due to the potential of signal wiring is reduced with respect to the active layer of the transistor.

Further, charges retained in an insulating film have an influence on the potential of the gate channel of a pixel driving transistor and fluctuate the threshold of the transistor.

The present embodiment is characterized in that the signal wiring 10-1 is not formed at the upper part of the gate channel region of a transistor, that is, the signal wiring 10-1 does not overlap the gate channel region of the transistor in a plan view. According to this characteristics, a fluctuation in the influence of charges retained in an insulating film due to the potential of signal wiring may be reduced with respect to the channel of a pixel driving transistor. Therefore, a phenomenon found out by the present inventors as a problem in which a streak occurs for each column or row due to radiation-induced degradation may be reduced. The mechanism found out by the present inventors will be described below.

Further, the width of the depletion layer of the PN junction part of the diffusion region of a transistor changes due to the influence of charges retained in an insulating film. As a result, the parasitic capacitance of a pixel transistor fluctuates, and a time constant with respect to the driving of a pixel circuit changes. On the other hand, the amount of the retained charges depends on an electric field applied to the insulating film during the irradiation of radiation. When signal wiring is formed at the upper part of the PN junction part, the amount of the charges retained in the insulating film becomes nonuniform for each column according to a difference in the potential of the signal wiring for each pixel column in a radiation irradiation period. As a result, fixed pattern noise for each pixel column occurs in an sensor output in an image after degradation. In this phenomenon, a slight difference for each column not visually recognizable before degradation is enhanced according to the degree of the degradation to be obvious. A reason for causing the difference for each column includes a difference in the parasitic capacitance of a vertical signal line, a difference in the layout position of a driving circuit connected to the vertical signal line, a difference in the power supply impedance of a circuit that drives the vertical signal line, or the like.

Further, according to the findings by the present inventors, the leak current of a PN junction part formed as the source and drain of a pixel driving transistor increases according to charges retained near the PN junction part. As known in a general CMOS sensor technology, the leak current degrades imaging performance. The influence of the leak current is remarkable particularly when a detection diode, the input unit of an amplification transistor, or the like operates as a floating node.

In view of this, the present embodiment employs a layout in which the signal wiring 10-1 is not formed at the upper part of the diffusion region (source/drain region) of a transistor, that is, a layout in which the signal wiring 10-1 and the diffusion region of the transistor do not overlap each other in a plan view. By such a layout, an increase in a leak current due to the irradiation of radiation may be reduced. Therefore, it is possible to reduce degradation in imaging performance due to the irradiation of radiation. In addition, the asymmetry of degradation due to radiation resulting from the asymmetry of a row or a column or the impedance or the like of a driving circuit may be reduced. As a result, it is also possible to improve radiation resistance in terms of the cyclical noise of an image.

Note that the present embodiment provides a surface irradiation type radiation detector (imaging device) capable of capturing an image by performing the irradiation of radiation from the surface of a semiconductor substrate in which wiring is formed, that is, a front surface side. The irradiated radiation may pass through a wiring layer and an interlayer insulating film and reach a detection diode.

Further, the radiation detected by the imaging device according to the present embodiment may be ionizing radiation such as X-rays and gamma rays or may be particle radiation such as alpha rays, beta rays, neutron rays, proton rays, electron rays, heavy ion rays, and meson rays.

Second Embodiment

The first embodiment describes a mode in which one signal wiring is provided with respect to one pixel column. The present embodiment will describe a mode in which a plurality of signal wiring lines are provided with respect to one pixel column.

(Configuration of Imaging Device)

Figure 4:
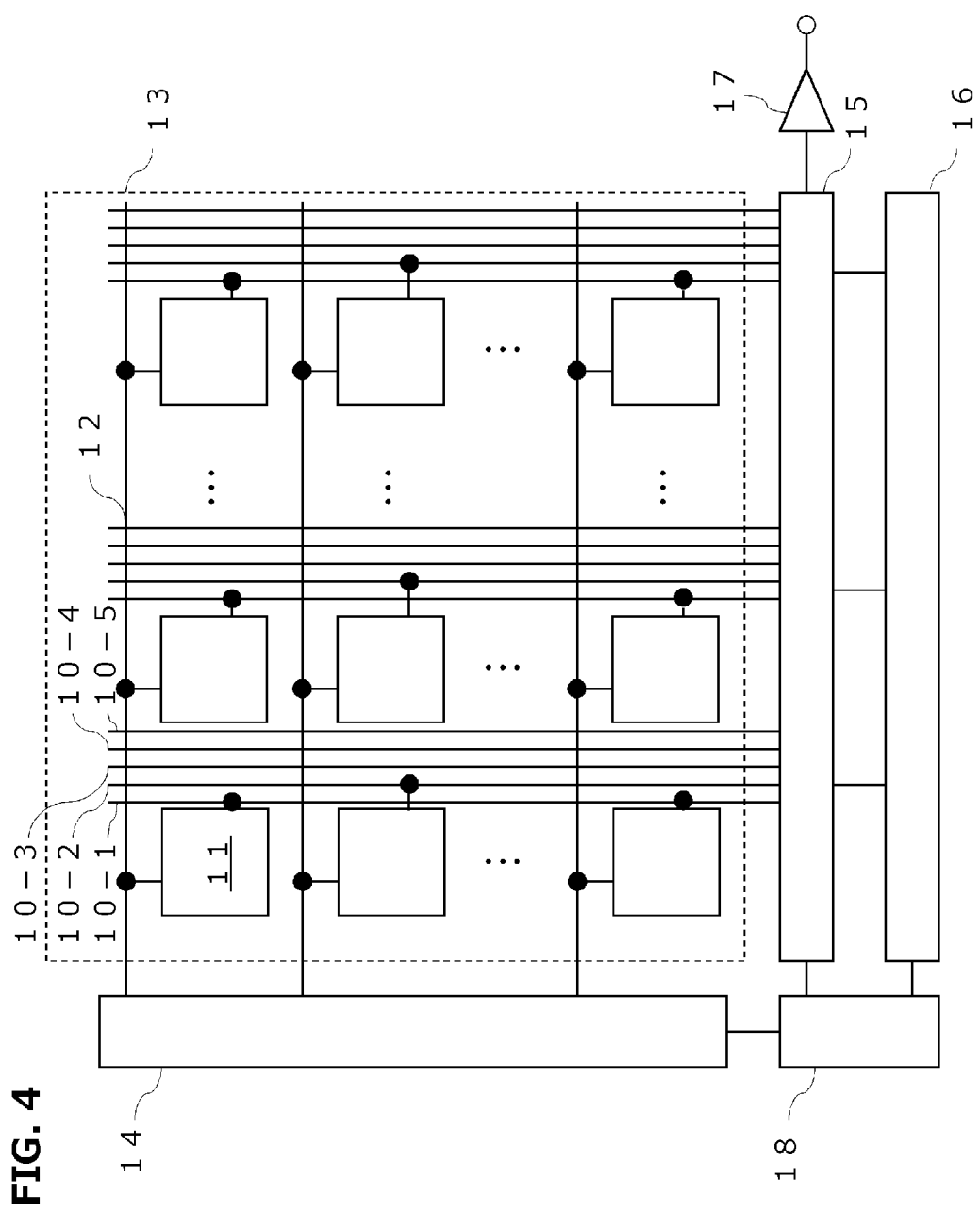
FIG. 4 is a diagram showing the configuration of an imaging device according to a second embodiment.

FIG. 4 is a diagram showing the configuration of an imaging device according to the present embodiment. In each of a plurality of columns of the present embodiment, a signal is output from the array of pixels 11 to each of signal wiring lines 10-1 to 10-5. Note that the same cell is repeatedly provided as an equivalent circuit in the array of the pixels 11 but different portions may exist corresponding to connected signal wiring lines as a physical layout. The present embodiment will describe a configuration in which five signal wiring lines are provided with respect to one pixel column, but the number of signal wiring lines is not particularly limited so long as at least two signal wiring lines are provided.

(Circuit Configuration of Pixel)

Figure 5:
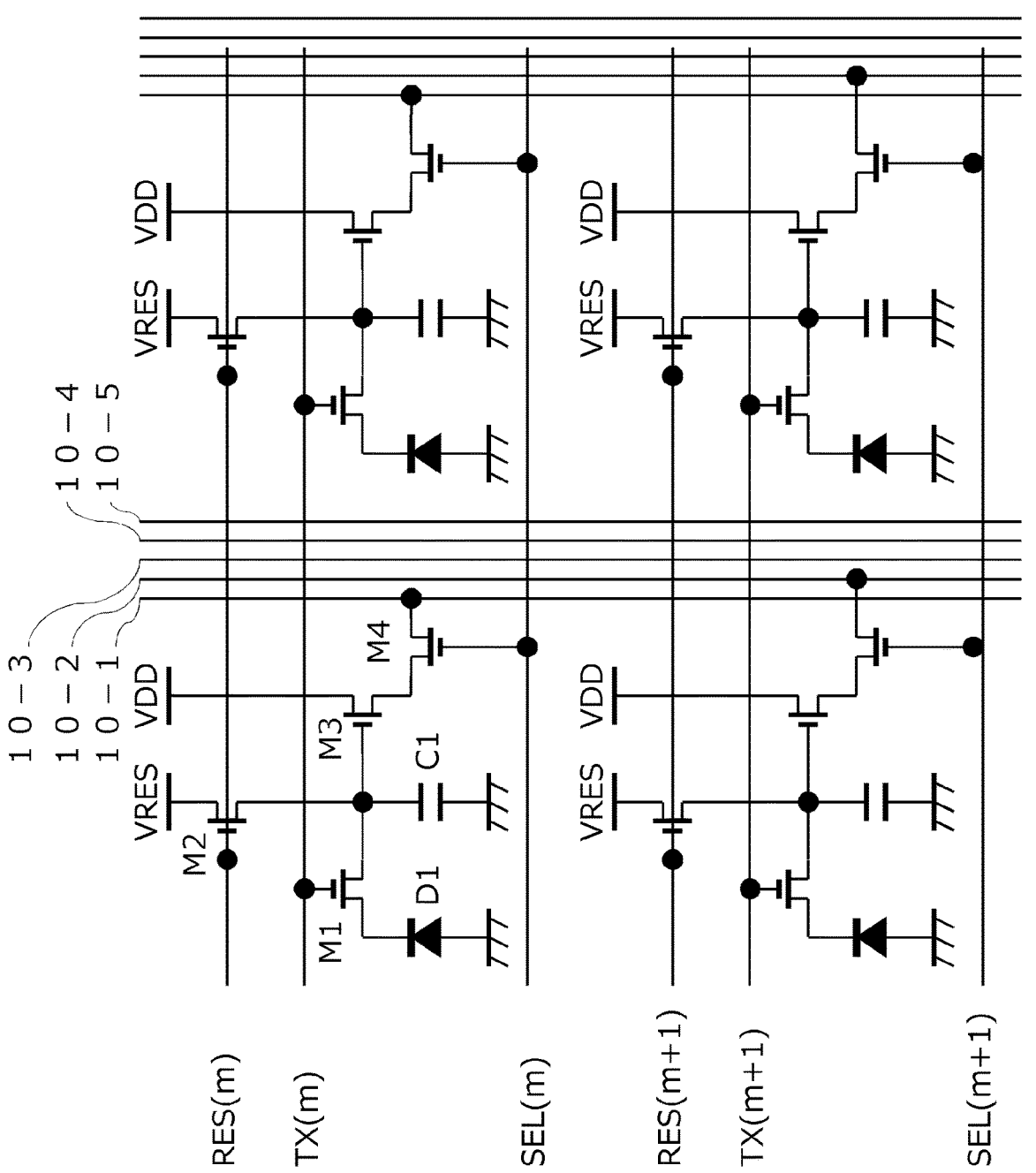
FIG. 5 is an equivalent circuit diagram of pixels according to the second embodiment.

FIG. 5 is an equivalent circuit diagram showing the circuits of two rows and two columns among the pixels 11 shown in FIG. 4. The pixels of the m-th row and the pixels of the m+1-th row are connected to the signal wiring line 10-1 and the signal wiring line 10-2, respectively. Similarly, the pixels of the m+2-th row, the pixels of the m+3-th row, and the pixels of the m+4-th row are connected to the signal wiring line 10-3, the signal wiring line 10-4, and the signal wiring line 10-5, respectively. A current source (not shown) is connected to the signal wiring lines 10-2 to 10-5 like the signal wiring 10-1 of the first embodiment.

When a signal SEL(m) turns to an active level, selection transistors M4 of the pixels of the m-th row are turned on. Thus, a current is supplied from the current source to amplification transistors M3 of the pixels of the m-th row. In each of the pixels of the m-th row, a source follower circuit is formed by a power supply voltage VDD, the amplification transistor M3, and the current source (not shown) connected to the signal wiring line 10-1. By the formation of the source follower circuit, the amplification transistor M3 outputs a signal based on the potential of a charge retention unit C1 to the signal wiring line 10-1 via the transistor M4.

Further, when a signal SEL(m+1) turns to an active level, the selection transistors M4 of the pixels of the m+1-th row are turned on. Thus, a current is supplied from the current source to the amplification transistors M3 of the m+1-th row. In each of the pixels of the m+1-th row, a source follower circuit is formed by the power supply voltage VDD, the amplification transistor M3, and the current source (not shown) connected to the signal wiring line 10-2. By the formation of the source follower circuit, the amplification transistor M3 outputs a signal based on the potential of the charge retention unit C1 to the signal wiring line 10-2 via the transistor M4.

As described above, the pixels of the m-th row and the pixels of m+1-th row are connected to the different signal wiring lines, respectively. Further, the pixels of the m+2-th row to the pixels of m+4-th row (not shown) are also connected to the different signal wiring lines, respectively.

According to the configuration, it is possible to achieve the speeding up of a detector with a plurality of signal wiring lines. Further, the signal wiring lines are also not formed at the upper part of the active layer of an amplification transistor in this case as well. Therefore, the effect of the first embodiment is obtained.

(Plan View of Pixel)

Figures 6A, 6B, 6C:
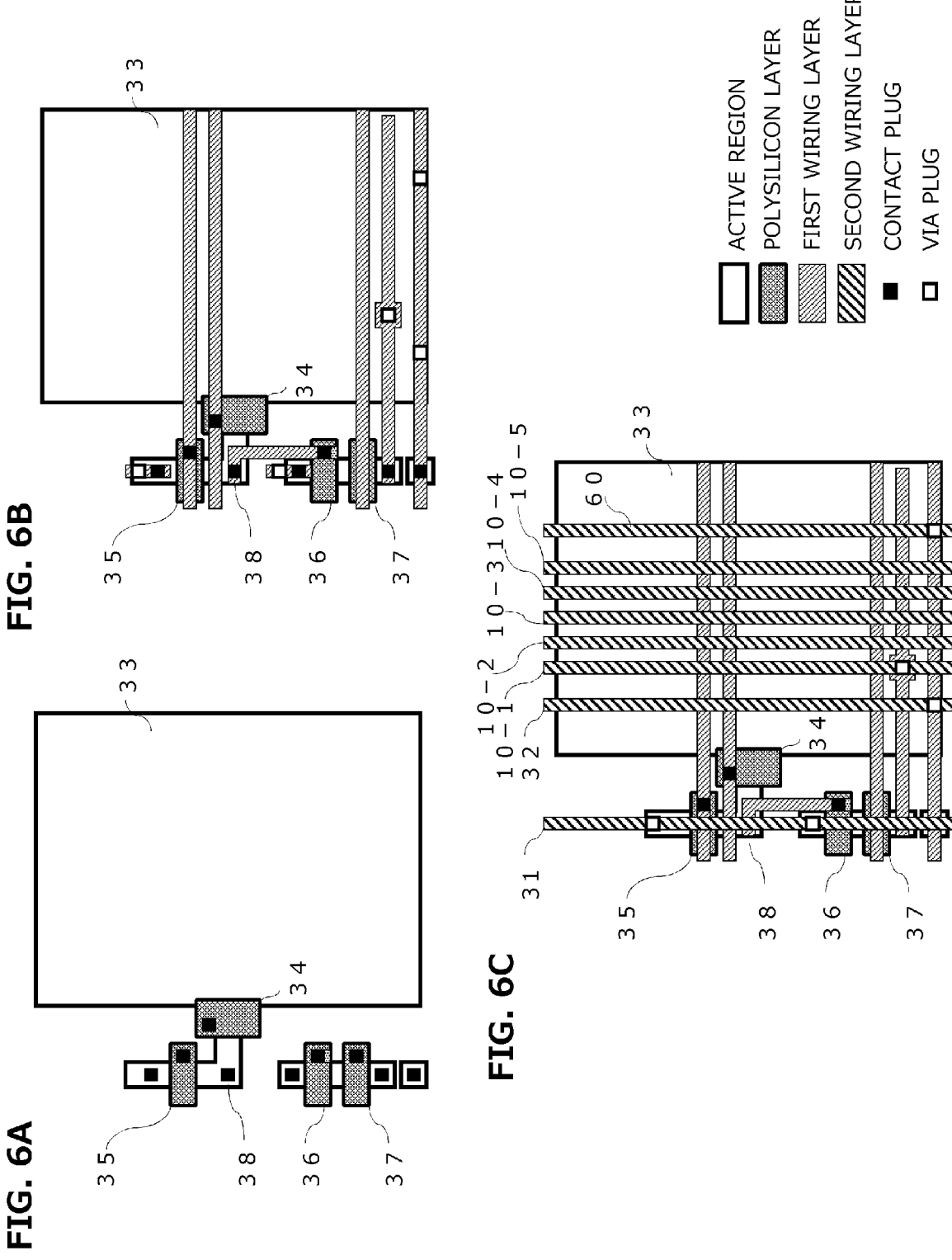
FIGS. 6A to 6C are top surface diagrams of a pixel according to the second embodiment.

FIGS. 6A to 6C are schematic diagrams for describing one layout of the pixels 11 shown in FIG. 4. The signal wiring lines 10-1 to 10-5 are arranged to be adjacent to each other and formed to be held between power supply wiring 32 and power supply wiring 60. Note that the signal wiring lines 10-1 to 10-5 are formed in the same layer as power supply wiring 31 that supplies a power supply voltage to the amplification transistor M3 and power supply wiring 32 that supplies potential to a well.

As described above, the plurality of signal wiring lines are formed and arranged to be adjacent to each other in the present embodiment. The expression "arranged to be adjacent to each other" can represent, for example, a state in which wiring other than the signal wiring lines is not arranged between the signal wiring lines at least in the same wiring layer.

In the present embodiment, the signal wiring line 10-1 is adjacent to the signal wiring line 10-2 and the power supply wiring 32, and the signal wiring line 10-5 is adjacent to the signal wiring line 10-4 and the power supply wiring 60.

Meanwhile, wiring lines to which the signal wiring lines 10-2, 10-3, and 10-4 are adjacent on their right and left sides are the signal wiring lines. That is, the signal wiring lines are arranged to be adjacent to each other, whereby the symmetry of crosstalk occurring in the signal wiring lines 10-2 to 10-4 may be improved. Further, the symmetry of an electric field occurring around the signal wiring lines 10-2 to 10-4 is also improved. According to the arrangement, the nonuniformity of the strength of the electric field between adjacent wiring lines may be reduced for each signal wiring. Therefore, a difference in the degradation between pixels due to the irradiation of radiation may be reduced, and fixed pattern noise after degradation due to radiation may be reduced.

Further, the intervals between adjacent signal wiring lines are smaller than the interval between a signal wiring line adjacent to power supply wiring and the power supply wiring. That is, the intervals between the adjacent signal wiring lines are smaller than the interval between the power supply wiring 32 and the signal wiring line 10-1 and the interval between the power supply wiring 60 and the signal wiring line 10-5. As described above, the interval between power supply wiring and a signal wiring line is made wider than the intervals between the signal wiring lines, whereby an electric field around the signal wiring lines may be reduced. Thus, since the influence of charges retained in an insulating film on each of the signal wiring lines may be reduced, noise after degradation may be reduced. Further, since an increase in an interface level during the irradiation of radiation may be reduced with respect to an interface around the signal wiring lines, degradation resistance to radiation may be improved. Note that the intervals between the adjacent signal wiring lines may not be constant, and the interval between the power supply wiring 32 and the signal wiring line 10-1 may not be the same as the interval between the power supply wiring 60 and the signal wiring line 10-5. Generally, a maximum one of the intervals between the adjacent signal wiring lines may only be smaller than both the interval between the power supply wiring 32 and the signal wiring line 10-1 and the interval between the power supply wiring 60 and the signal wiring line 10-5.

Third Embodiment

Figure 7:
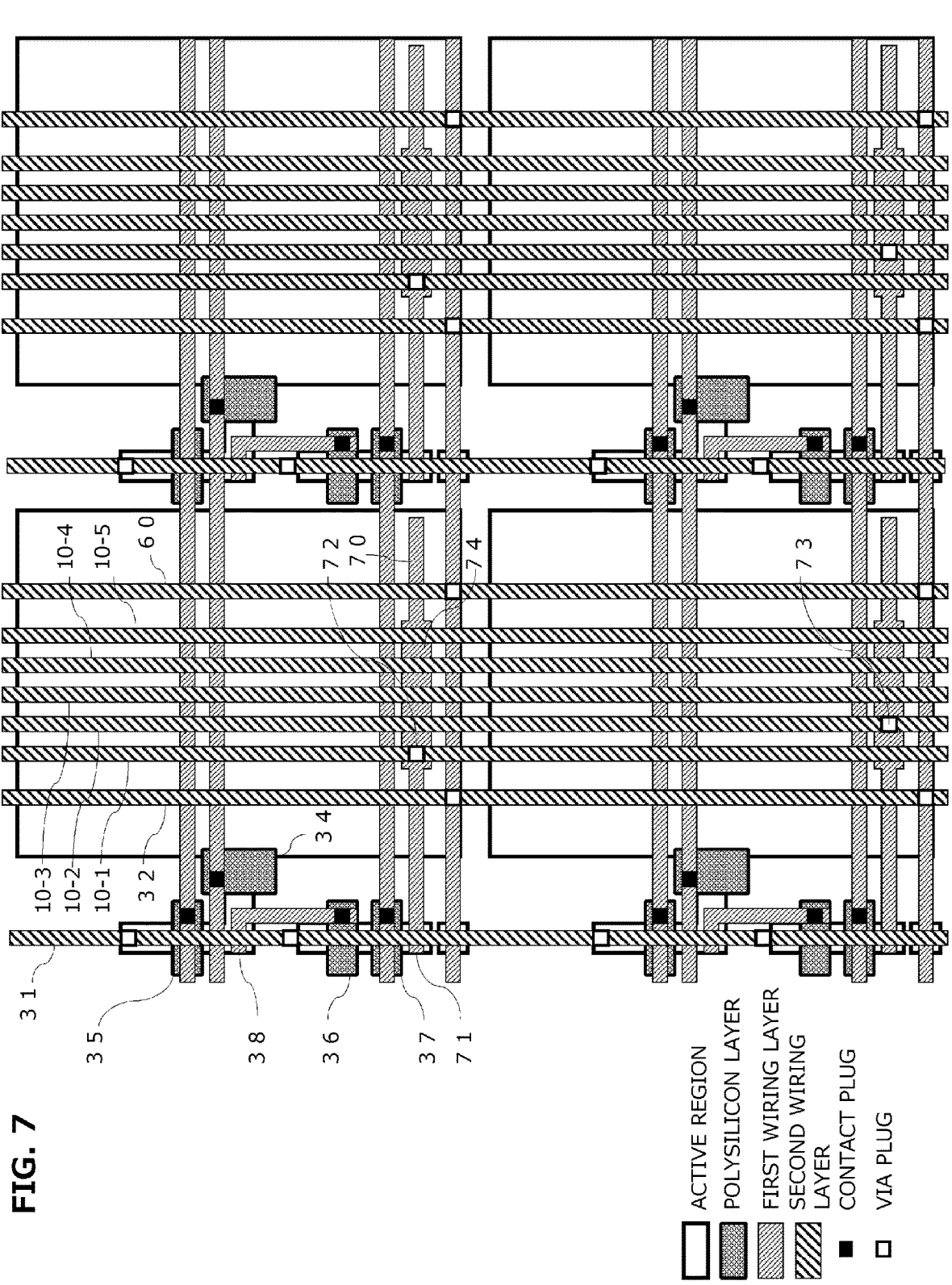
FIG. 7 is a top surface diagram of pixels according to a third embodiment.

A third embodiment of the present invention is shown in FIG. 7. In FIG. 7, the descriptions of the same components as those of FIGS. 6A to 6C are the same. FIG. 7 is a diagram showing all active regions, polysilicon layers, contact plugs, via plugs, first wiring layers, and second wiring layers. The structures of the layers are understandable with reference to other embodiments, and therefore partial diagrams of the respective layers will be omitted.

Connection wiring 70 is connected to a source 71 of a selection transistor, formed in a layer different from that of signal wiring lines 10-1 to 10-5, and connected to the signal wiring lines 10-1 to 10-5 via a via plug (via hole) 72. The connection wiring 70 is provided for each amplification transistor M3. Further, the connection wiring 70 is laid out to be substantially orthogonal to at least any of the signal wiring lines 10-1 to 10-5 in a plan view.

In the present embodiment, the asymmetry of the parasitic capacitance between the connection wiring 70 to which an amplification transistor is connected and the respective signal wiring lines 10-1 to 10-5 may be reduced. Therefore, a difference in degradation resistance may be reduced for each pixel row, and fixed pattern noise after the irradiation of radiation may be reduced.

The connection wiring 70 has a wide part 74 having a constant width larger than those of other portions at its portion overlapping the signal wiring lines 10-1 to 10-5, and the via hole 72 is provided at a position at which the wide part 74 and a signal wiring line to which a pixel signal is output overlap each other. Accordingly, a position at which the via hole 72 is provided is different depending on a pixel. However, the plane layouts of respective pixels in a pixel array may be formed in substantially the same shape except for the via hole 72. In the present embodiment, the via hole 72 is arranged at a different cycle on the same pixel column on a fixed repetition basis. In the embodiment, the output of the amplification transistor of the m-th row is connected to the signal wiring line 10-1 via the via hole 72, and the output of the amplification transistor of the m+1-th row is connected to the signal wiring line 10-2 via a via hole 73. That is, it is possible to change a pixel layout according to a difference in a read signal wiring line only with a via hole. Thus, the symmetry of coupling with other wiring lines in a charge retention unit, an amplification transistor, or the like may be improved for each pixel. Therefore, a difference in the degradation resistance between respective pixels may be reduced, and fixed pattern noise after the irradiation of radiation may be reduced.

In the present embodiment, the overlapping areas of portions at which the signal wiring lines 10-1 to 10-5 and the connection wiring 70 cross each other in a plan view may have substantially the same value at the intersecting points of all the pixels. Accordingly, cyclical asymmetry for each pixel row may be reduced. Therefore, the degree of a difference in degradation resistance may be further reduced for each row, and fixed pattern noise after the irradiation of radiation may be reduced.

Fourth Embodiment

Figures 8A, 8B, 8C:
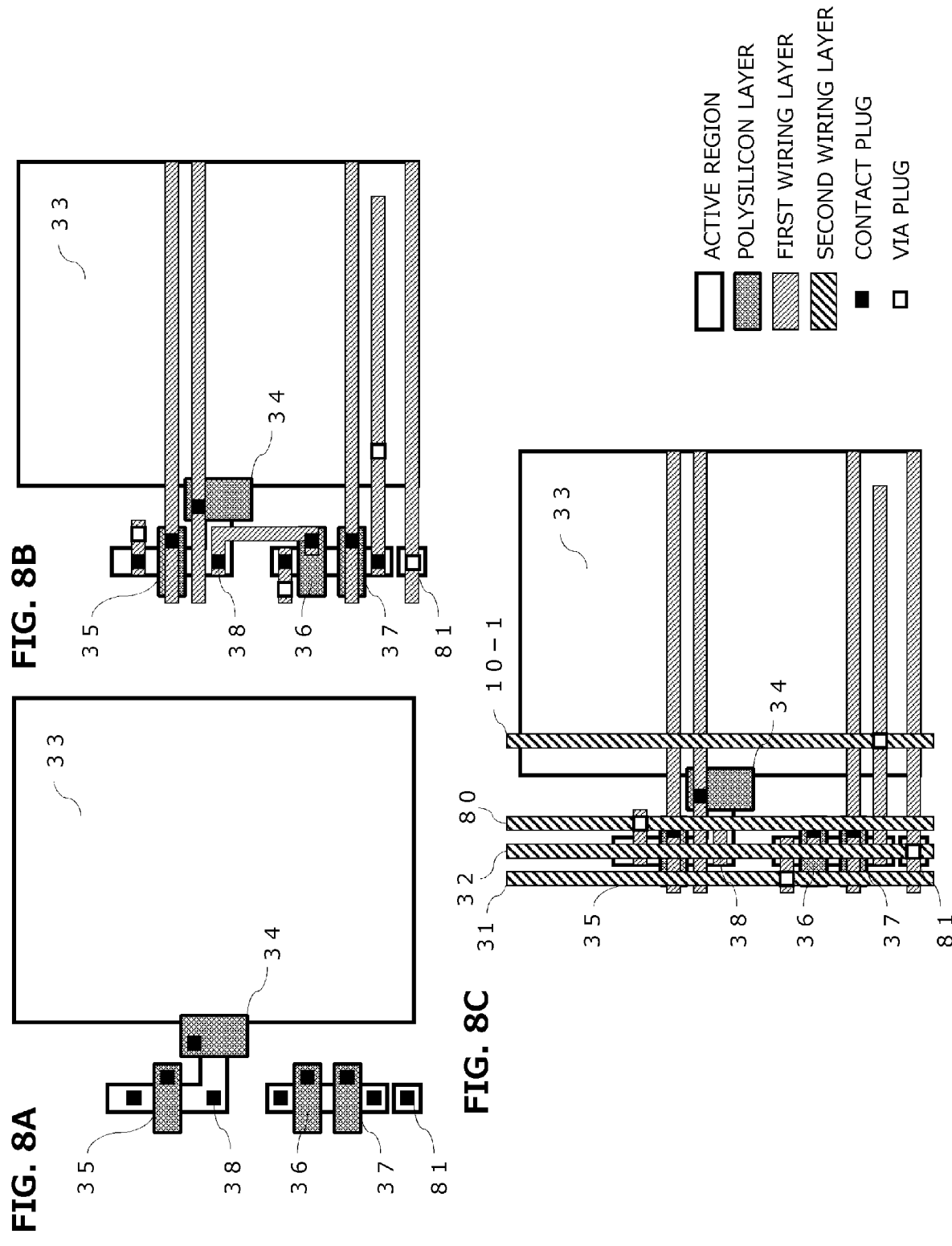
FIGS. 8A to 8C are top surface diagrams of a pixel according to a fourth embodiment.

A pixel layout according to a fourth embodiment of the present invention is shown in FIGS. 8A to 8C. In the present embodiment, power supply wiring 31 that supplies the drain potential of an amplification transistor, power supply wiring 32 that supplies a well potential, power supply wiring 80 that supplies the drain potential of a reset transistor M2, and a contact 81 that supplies a well potential to a semiconductor substrate are provided. In the present embodiment, the power supply wiring 32 is arranged to be held between the power supply wiring 31 and the power supply wiring 80.

Generally, in an NMOS-type pixel configuration, a well potential is a low potential such as a ground potential, and the drain potential and reset potential of an amplification transistor are high potentials. Further, in a reset state, the potential of pixel signal wiring becomes high to follow the drain potential of a reset transistor. In the present embodiment, the power supply wiring 80 (of the same pixel) and the power supply wiring 31 (of an adjacent pixel) are arranged to be adjacent to signal wiring 10-1. By arranging the signal wiring 10-1 and the power supply wiring 80 to be adjacent to each other and arranging the signal wiring 10-1 and the power supply wiring 31 to be adjacent to each other, an electric field in a lateral direction around the signal wiring 10-1 may be reduced compared with a layout in which the signal wiring 10-1 and the power supply wiring 32 are arranged to be adjacent to each other. Accordingly, the influence of charges retained in an insulating film may be reduced, and noise after degradation may be reduced.

Fifth Embodiment

Figures 9A, 9B, 9C:
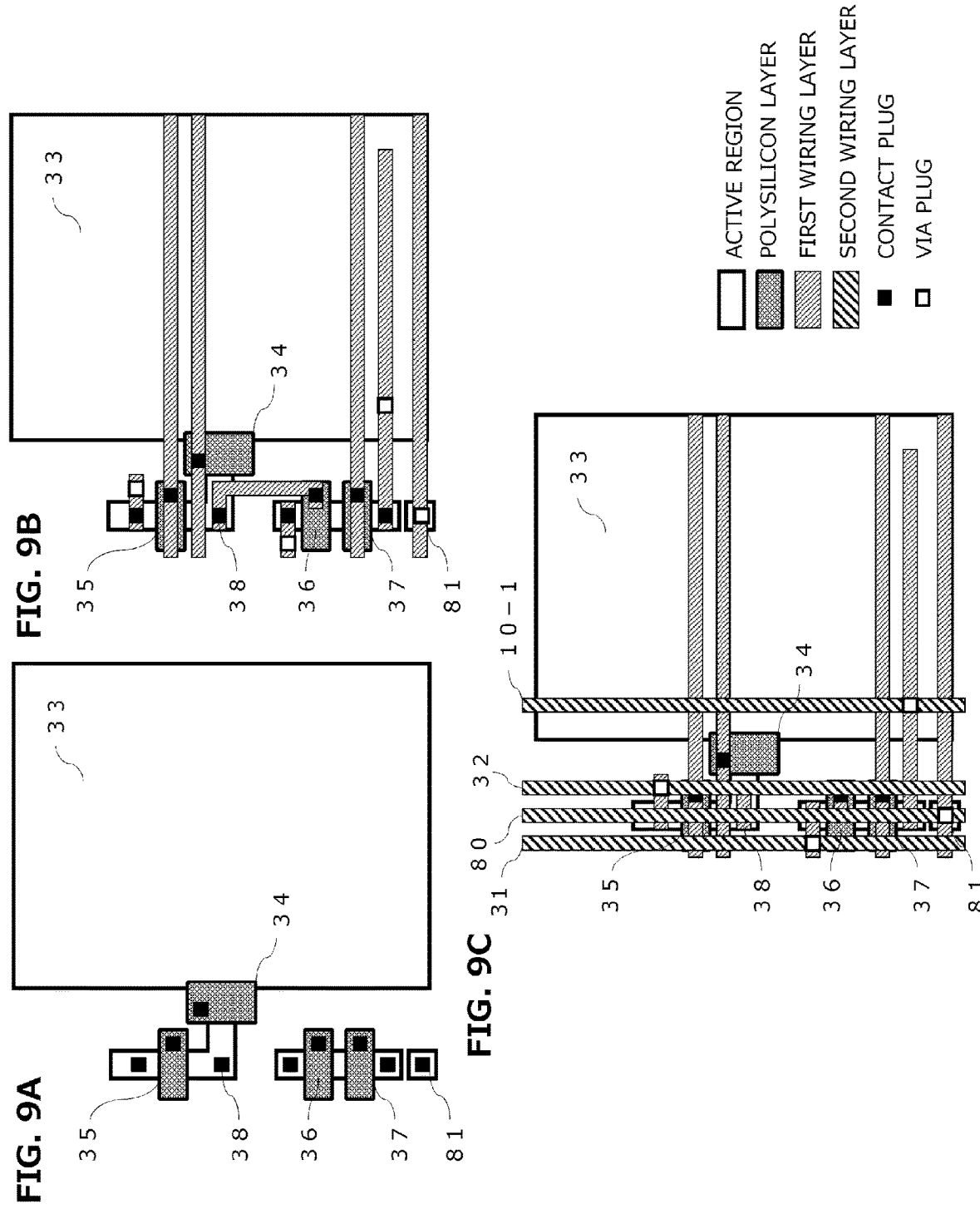
FIGS. 9A to 9C are top surface diagrams of a pixel according to the fifth embodiment.

A fifth embodiment of the present invention will be described using FIGS. 9A to 9C.

The fifth embodiment is different from the fourth embodiment in the arrangement order of power supply wiring 31, 32, and 80. In the present embodiment, the power supply wiring 31, the power supply wiring 80, and the power supply wiring 32 are arranged in this order, and the power supply wiring 80 is arranged to be held between the power supply wiring 31 and the power supply wiring 32. Thus, capacitive coupling by the parasitic capacitance between the power supply wiring 80 and the signal wiring 10-1 may be reduced. In the power supply wiring 80, a fluctuation in a voltage transiently occurs during the reset operation of a sensor in some cases. In the present embodiment, the signal wiring 10-1 may be shielded from the influence of the fluctuation in the voltage of the power supply wiring 80 by the shielding operation of the power supply wiring 32. Thus, a transient fluctuation in an electric field in a lateral direction around signal wiring may be reduced. Therefore, a fluctuation in a pixel output after degradation depending on a voltage state may be reduced.

Sixth Embodiment

A sixth embodiment has a configuration in which the first to fifth embodiments described above are combined together. The present embodiment will be described with reference to FIGS. 10A to 10C.

In the present embodiment, signal wiring is not formed at the upper part of the active layer of an amplification transistor. Further, the signal wiring includes a plurality of signal wiring lines, and the signal wiring lines are arranged to be adjacent to each other. Further, connection wiring orthogonal to any of the signal wiring lines is provided. Except for a via hole that connects the connection wiring and the signal wiring lines, all the pixels of a pixel array have the same layout in a plan view. The areas of portions at which the signal wiring lines and the connection wiring are orthogonal to each other in a plan view are the same in all the signal wiring lines. Three power supply wiring lines are provided.

According to the configuration, high-speed reading is enabled in a sensor that suppresses an influence on image quality by degradation due to radiation. Therefore, it is possible to manufacture a detector capable of acquiring image data at a high frame-rate.

Seventh Embodiment

Figures 11A, 11B, 11C:
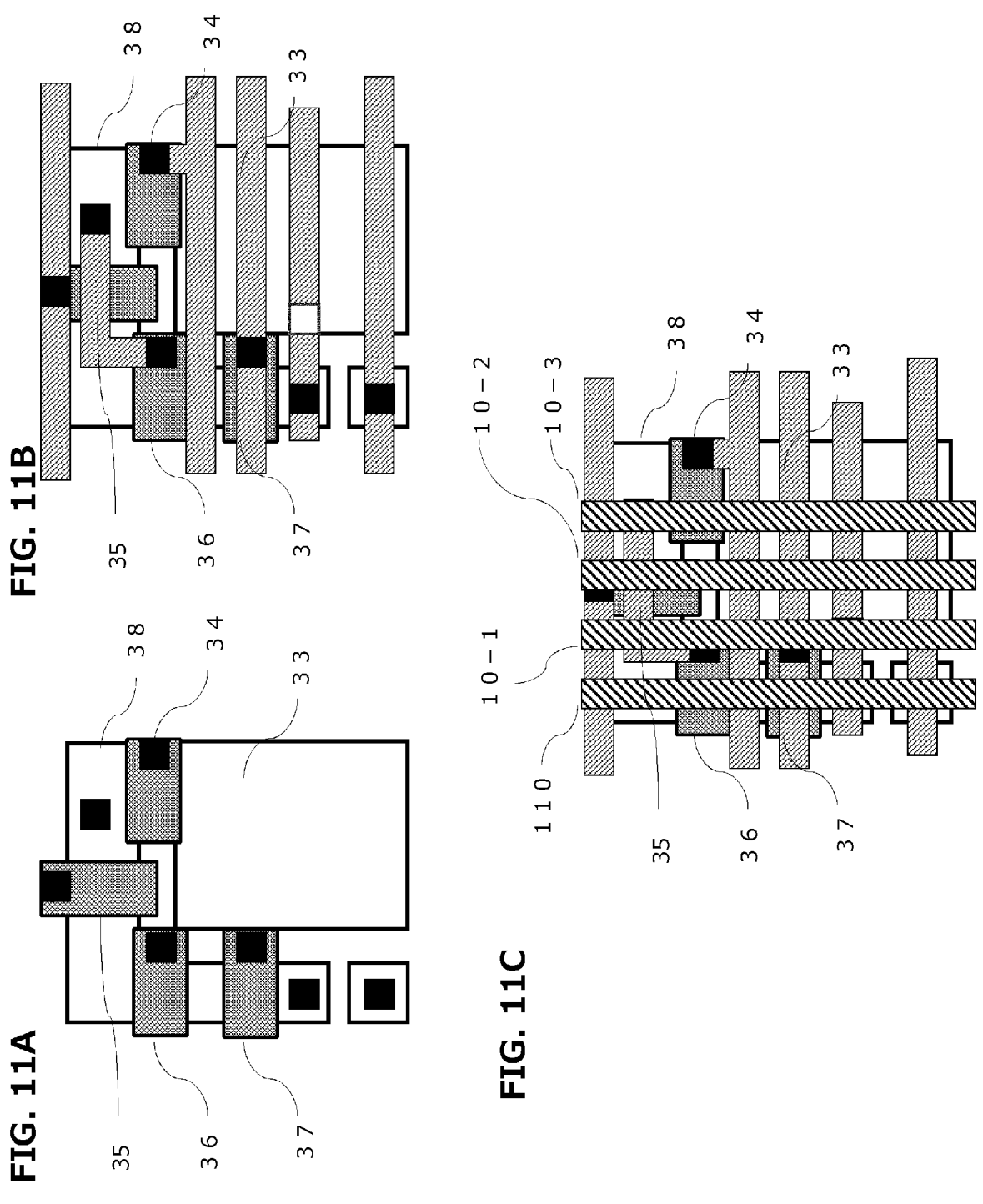
FIGS. 11A to 11C are top surface diagrams of a pixel according to a seventh embodiment.

The present embodiment will describe an example of realizing the speeding up of imaging while obtaining the effect of improving radiation resistance. FIGS. 11A to 11C are schematic diagrams for describing a pixel layout according to the present embodiment. Here, an example in which a pixel pitch is 2 μm is shown. The descriptions of the numerals of respective components are the same as those of the embodiments described above. Here, wiring has an L/S (Line and Space) of 0.2 μm, and an amplification transistor has a channel width of 0.4 μm. Signal wiring lines 10-1 to 10-3 are arranged so as not to overlap the channel or source/drain of an amplification transistor. Therefore, signal wiring lines are arranged at the upper part of a detection diode D1 (region 33) in the present embodiment. Further, power supply wiring 110 that drives a pixel is arranged at the upper part of a region in which transistors constituting a pixel circuit are arranged. The power supply wiring 110 is singly shown in FIG. 11C but may include a plurality of power supply wiring lines. For example, power supply wiring 31 that supplies the drain potential of an amplification transistor, power supply wiring 32 that supplies a well potential, and power supply wiring 80 that supplies the drain potential of a reset transistor M2 are arranged at the upper part of the region in which the transistors are arranged (see FIGS. 9A to 9C and 10A to 10C).

In the present embodiment, the number of signal wiring lines per pixel pitch may be at least three while a layout is performed according to the present invention. Therefore, it is possible to achieve both radiation resistance and speeding up.

Eighth Embodiment

An eighth embodiment will describe a mode in which an amplification transistor is arranged to be included in a radiation detection element in a plan view so that the sensitivity of a detector may be improved.

Figure 12:
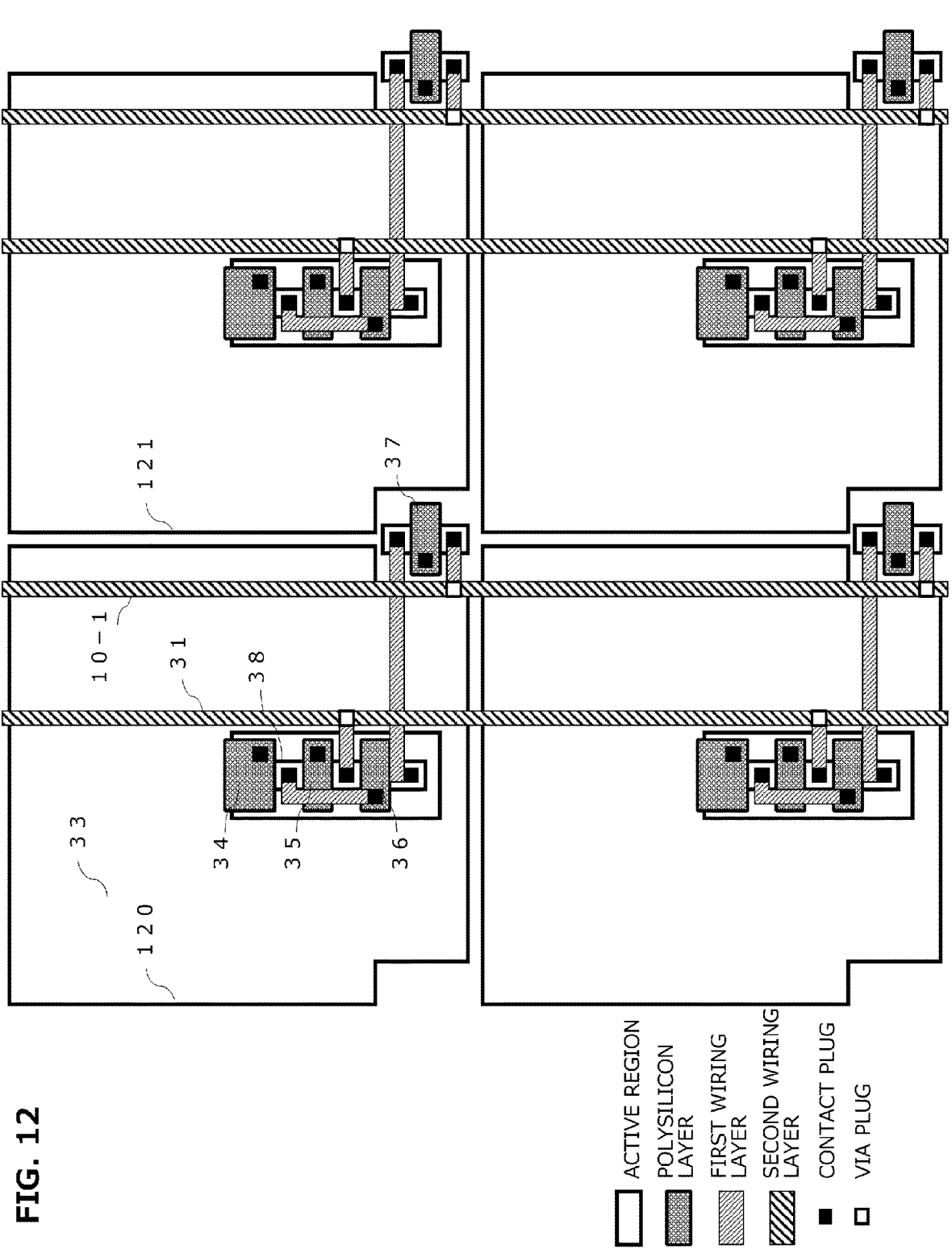
FIG. 12 is a top surface diagram of pixels according to an eighth embodiment.

In the present embodiment, a radiation detection element D1 (region 33) is defined by an active layer 120 and a frame-shaped inactive layer 121 provided for each unit pixel as shown in FIG. 12. The inactive layer 121 has a pixel isolation structure formed to surround the radiation detection element D1, and a plurality of the radiation detection elements D1 are isolated by the inactive layer 121. The active region 33 of the radiation detection element D1 is positioned inside a region surrounded by the inactive layer 121 having the pixel isolation structure.

In the present embodiment, a charge retention unit 38 is arranged to be surrounded by the active region 33 of the detection element D1. Further, a gate electrode 36 of an amplification transistor is similarly arranged to be surrounded by the active region 33 of the detection element D1. More specifically, both the charge retention unit and the amplification transistor are arranged in a region that is inside the inactive layer 121 (having the pixel isolation structure) and surrounded by the active region 33. The expression "the region surrounded by the active region" represents a region in which an active region exists substantially in all directions. In a plan view, the entire outer periphery of the region may be surrounded by one active region, or a part of the entire outer periphery may be an isolation region. By the employment of such an arrangement, the charge retention unit 38 and the gate electrode 36 of the amplification transistor may be arranged to be adjacent to each other. As a result, the parasitic capacitance of the charge retention unit may be reduced. Therefore, it is possible to acquire the high sensitivity of a detector.

With reference to FIG. 12, the present embodiment describes the mode in which a detection element is defined by an active layer. However, the same effect is obtained even if the detection element is defined according to the conductivity type or concentration of a semiconductor region.

Ninth Embodiment

A ninth embodiment of the present invention will describe a mode using a pixel circuit system called a three-transistor system in a CMOS area sensor technology in which a transfer transistor is not provided and a radiation detection element and a charge retention unit are electrically connected to each other. In the present embodiment, the amplification transistor is arranged to be surrounded by a detection diode in a plan view so that the sensitivity of a detector may be improved.

Figure 13:
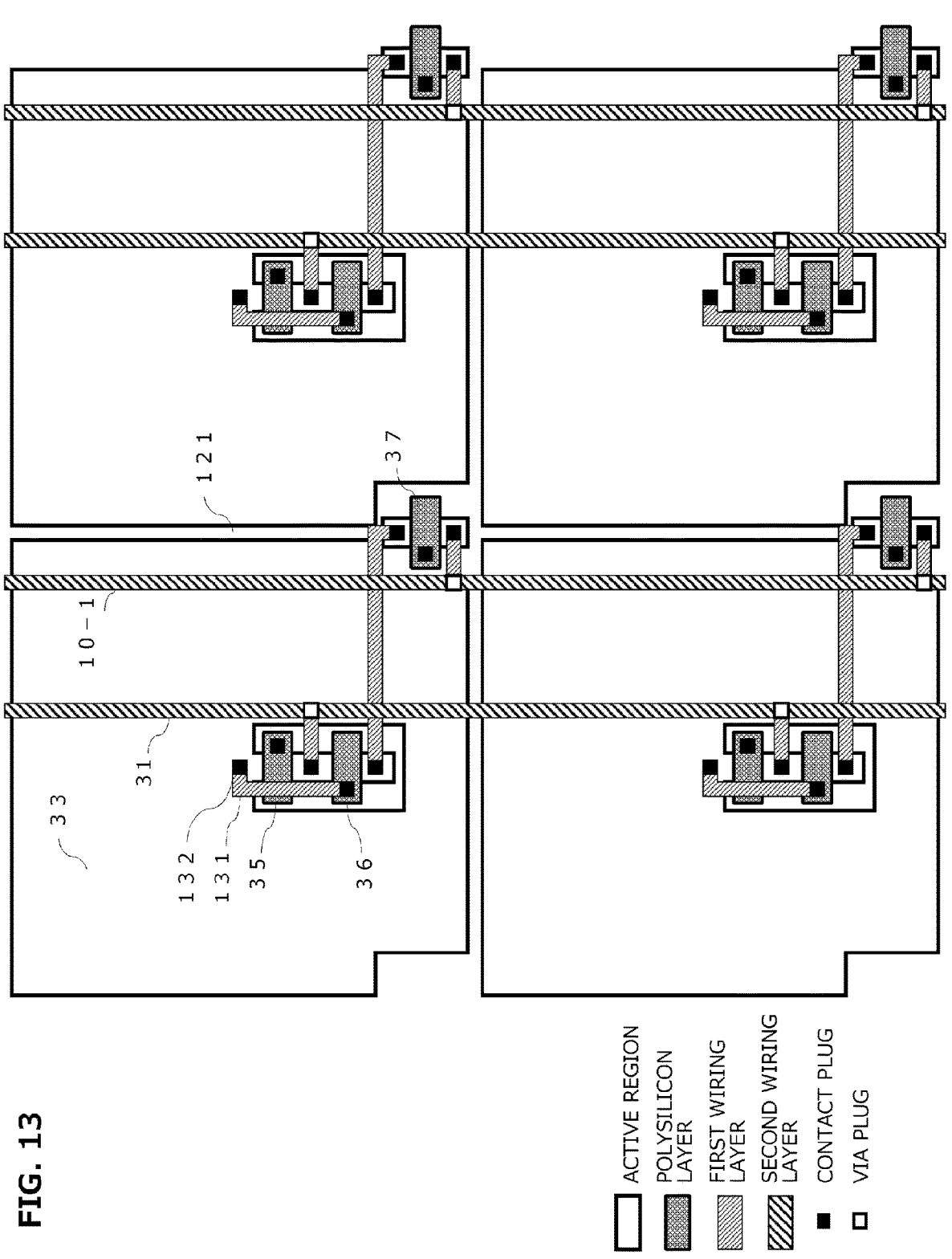
FIG. 13 is a top surface diagram of pixels according to a ninth embodiment.

In the present embodiment, a radiation detection element of a unit pixel is defined by an active layer 33 and an inactive layer 121 and isolated from the radiation detection element of an adjacent pixel by a frame-shaped inactive layer 121 as shown in FIG. 13. In the present embodiment, wiring 131 connects an extraction unit 132 used to extract charges from the radiation detection element and a gate electrode 36 of the amplification transistor.

In the present embodiment, the gate electrode 36 of the amplification transistor is arranged to be surrounded by the active layer 33 of the radiation detection element, whereby it is possible to obtain a layout in which the extraction unit 132 of the radiation detection element and the gate electrode 36 of the amplification transistor get close to each other. Therefore, the wiring 131 that connects the extraction unit 132 and the gate electrode 36 may be shortened. According to this arrangement, it is possible to reduce the parasitic capacitance of the radiation detection element and increase conversion gain. As a result, the high sensitivity of a detector is enabled.

In addition, compared with a radiation detector having pixels each including a transfer transistor M1, the present invention is free from the influence of the degradation of the transfer transistor M1 due to radiation. Therefore, an improvement in degradation resistance to radiation is enabled.

With reference to FIG. 13, the present embodiment describes the mode in which a detection element is defined by an active layer. However, the same effect is obtained even if the detection element is defined according to the conductivity type or concentration of a semiconductor region.

Further, even in a mode in which a plurality of signal wiring lines are arranged in one pixel column, the wiring 131 that connects a charge retention unit and the gate of an amplification transistor may be shortened. Therefore, the same effect is obtained.

Tenth Embodiment

A tenth embodiment will describe the modes of the relative position between connection wiring orthogonal to signal wiring lines and the signal wiring lines and the relative position between the layout of pixel isolation and the layout of the signal wiring lines that are arranged in a transitional symmetry on a pixel-by-pixel basis.

Figure 14:
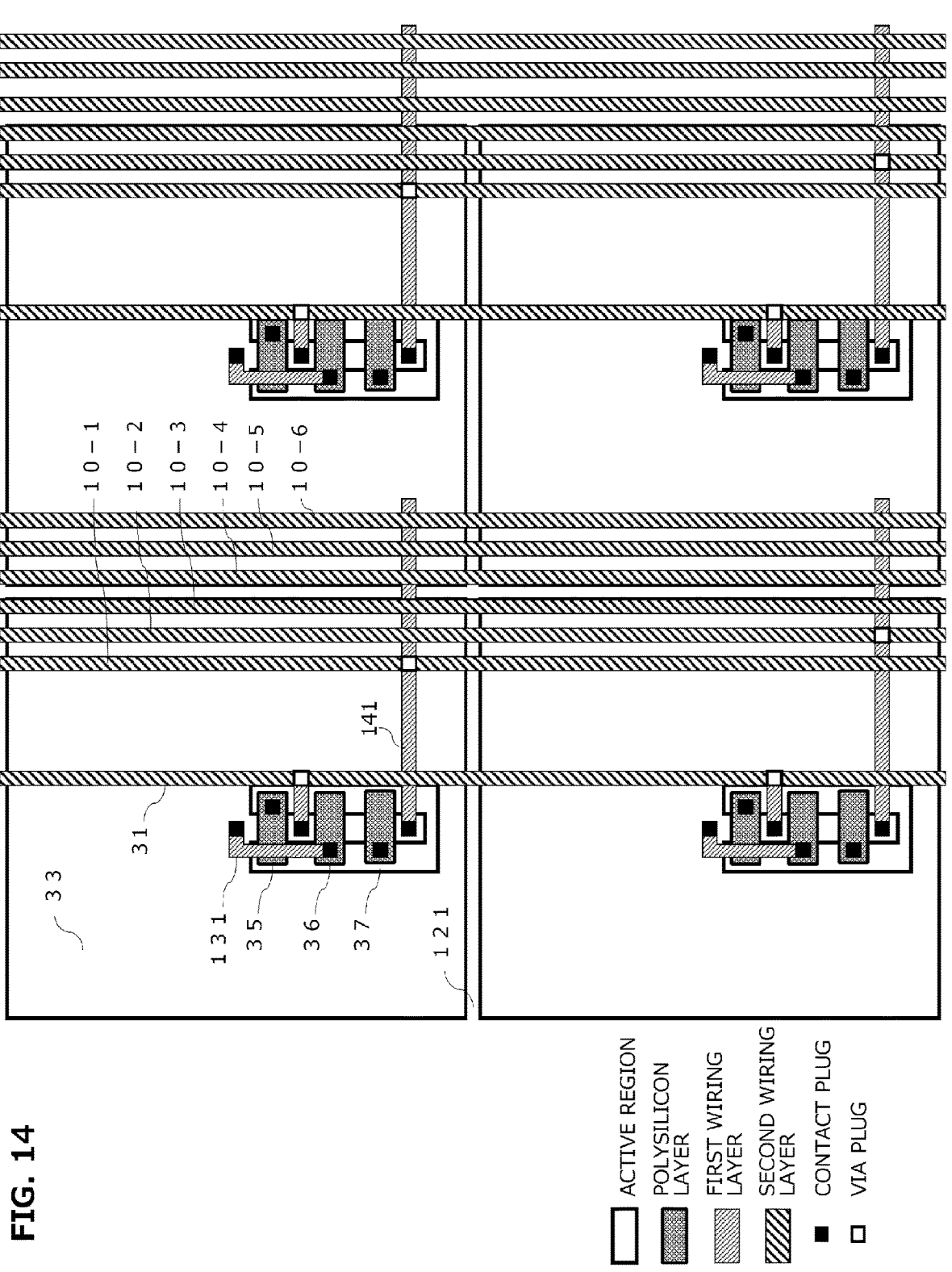
FIG. 14 is a top surface diagram of pixels according to a tenth embodiment.

As shown in FIG. 14, pixels 11 have connection wiring 141 that connects an amplification transistor and signal wiring lines in the present embodiment. The connection wiring 141 is provided for each amplification transistor, formed in a metal layer different from that of the signal wiring lines, orthogonal to at least any of the signal wiring lines. The connection wiring and the signal wiring lines are connected to each other via a via hole. With a contact used to connect the connection wiring and the transistor as a start point, the connection wiring extends only in the direction of the signal wiring lines collectively arranged on one direction side (right side in FIG. 14) of the pixels in a plan view. Note that the connection wiring 141 may have a wide part having a constant width larger than those of other portions at its portion overlapping the signal wiring lines (see FIG. 7).

As shown in FIG. 14, signal wiring lines 10-1 to 10-6 of one pixel column are arranged at the same cycle as a pixel pitch in a pixel array 13. On this occasion, the center of a region in which the plurality of signal wiring line are arranged is shifted by a substantially half phase from the center of a detection diode region at a repetition cycle. By such an arrangement, it is possible to maintain the distance between the extracting position of the detection diode and the vertical signal lines and reduce an electric field in an insulating film. Therefore, radiation resistance may be improved.

In addition, the pixels 11 have the same layout in a plan view except for the via hole, and only the via hole is arranged at a different cycle on the same pixel column on a fixed repetition basis. Further, in the present embodiment, the overlapping areas of portions at which the signal wiring lines 10-1 to 10-6 and the connection wiring 141 cross each other in a plan view may have substantially the same value at the intersecting points of all the pixels. According to this configuration, symmetry may be improved except for the signal wiring lines. Therefore, a difference in degradation resistance may be further reduced for each of the pixels after the irradiation of radiation.

Further, in the present embodiment, the intervals between adjacent signal wiring lines are smaller than the interval between a signal wiring line adjacent to power supply wiring and the power supply wiring. That is, the intervals between the adjacent signal wiring lines are smaller than the interval between the signal wiring line 10-1 and power supply wiring 31 of the same pixel and the interval between the signal wiring line 10-6 and power supply wiring 31 of an adjacent pixel. As described above, the interval between power supply wiring and a signal wiring line is made wider than the intervals between the signal wiring lines, whereby an electric field around the signal wiring lines may be reduced. Thus, since the influence of charges retained in an insulating film on the respective signal wiring lines is reduced, noise after degradation may be reduced. Further, since an increase in a surface level during the irradiation of radiation is reduced with respect to an interface around the signal wiring lines, degradation resistance to the radiation may be improved. Note that the intervals between the adjacent signal wiring lines may not be constant, and the interval between the power supply wiring 31 (of the same pixel) and the signal wiring line 10-1 and the interval between the power supply wiring 31 (of the adjacent pixel) and the signal wiring line 10-6 may not be the same. Generally, a maximum one of the intervals between the adjacent signal wiring lines may only be smaller than the interval between the power supply wiring 31 (of the same pixel) and the signal wiring line 10-1 and the interval between the power supply wiring 31 (of the adjacent pixel) and the signal wiring line 10-6. Note that the present embodiment describes a configuration in which six signal wiring lines are arranged with respect to one pixel column. However, the number of signal wiring lines is not particularly limited so long as at least two signal wiring lines are arranged.

Eleventh Embodiment

Figure 15:
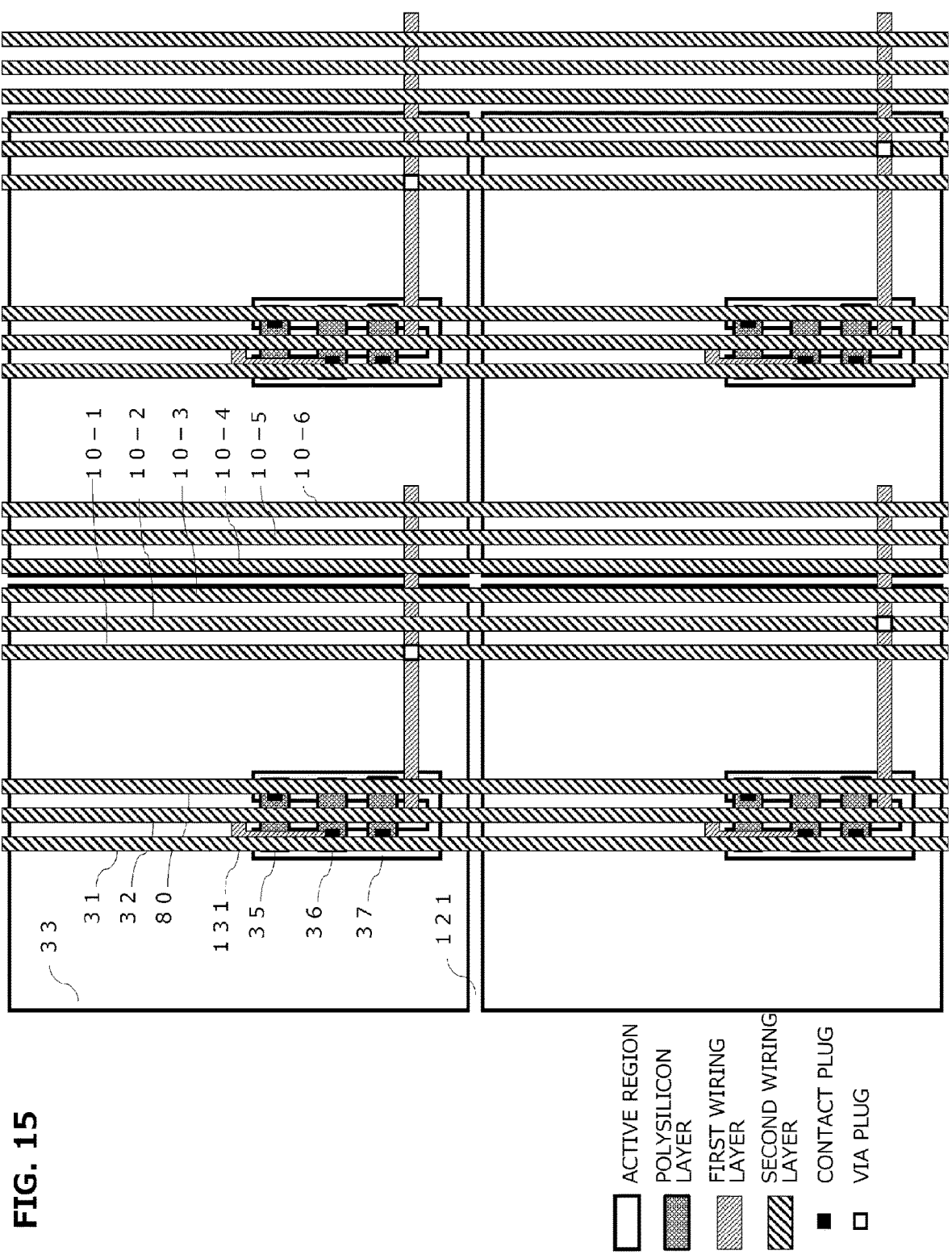
FIG. 15 is a top surface diagram of pixels according to an eleventh embodiment.

The first to tenth embodiments described above may be arbitrarily combined together without hindering their effects. With reference to FIG. 15, an eleventh embodiment will describe a configuration in which the embodiments described above are combined together.

In the present embodiment, signal wiring is not formed at the upper part of the active layer of an amplification transistor. Further, the signal wiring includes a plurality of signal wiring lines, and the signal wiring lines are arranged to be adjacent to each other. Further, connection wiring orthogonal to any of the signal wiring lines is provided. Except for a via hole that connects the connection wiring and the signal wiring lines, the pixels of a pixel array have the same layout in a plan view. The areas of portions at which the signal wiring lines and the connection wiring are orthogonal to each other in a plan view are the same in all the signal wiring lines. Three power supply wiring lines are provided. The power supply wiring lines are arranged to overlap the amplification transistor in a plan view. The signal wiring lines are arranged so as not to overlap the amplification transistor, but at least the three signal wiring lines are arranged to overlap the active layer of a radiation detection element. The amplification transistor is arranged inside a pixel isolation structure in a plan view and employs a pixel circuit system called a three-transistor system. With a contact used to connect the connection wiring and the transistor as a start point, the connection wiring extends only in the direction of the signal wiring lines collectively arranged on the right side of the pixels in a plan view.

It may be easily understood that the first to tenth embodiments are combined together in a manner other than the above. For example, instead of the three-transistor system, a four-transistor system (first embodiment) using a transfer transistor may be employed. Further, instead of a configuration in which power supply wiring 31, power supply wiring 32, and power supply wiring 80 are arranged in this order, a configuration (fifth embodiment) in which the power supply wiring 31, the power supply wiring 80, and the power supply wiring 32 are arranged in this order may be employed.

According to the present embodiment, high-speed reading is enabled in a sensor that suppresses an influence on image quality by degradation due to radiation. Therefore, it is possible to manufacture a detector capable of acquiring image data at a high frame-rate.

Twelfth Embodiment

Figure 16:
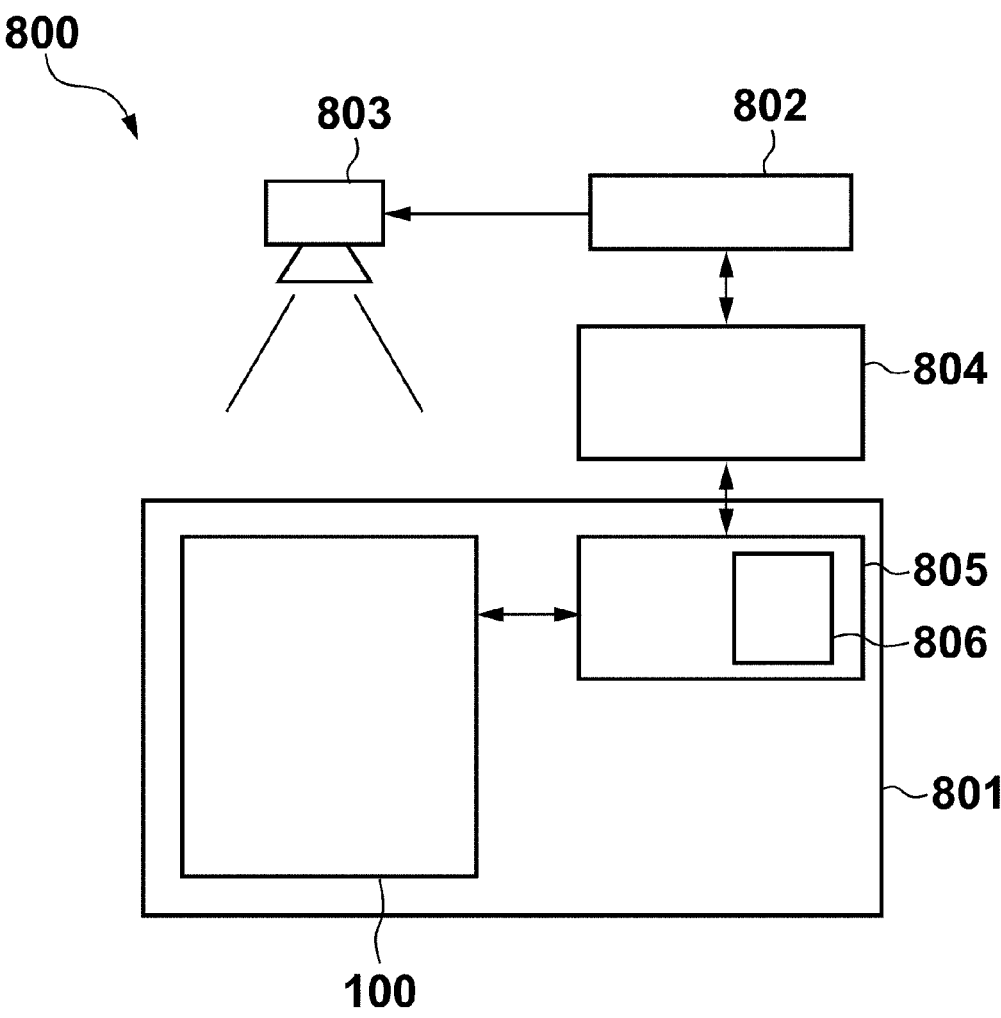
FIG. 16 is a schematic diagram for describing a radiation imaging system according to a twelfth embodiment.

With reference to FIG. 16, a radiation imaging device 801 in which the radiation detector according to any of the first to eleventh embodiments described above is incorporated and a radiation imaging system 800 using the radiation imaging device will be described.

The radiation imaging system 800 is configured to electrically capture an optical image formed by radiation and obtain electric radiation image (that is, radiation image data). The radiation imaging system 800 includes, for example, the radiation imaging device 801, an exposure control unit 802, a radiation source 803, and a computer 804. The radiation imaging system 800 is able to display a captured radiation image on a display device (not shown) or transmit radiation image data to the outside via a communication device (not shown). The radiation imaging system 800 can be suitably used in the field of, for example, medical image diagnosis, nondestructive inspection, or the like.

The radiation source 803 used to perform the irradiation of radiation starts the irradiation of the radiation according to exposure instructions from the exposure control unit 802. The radiation emitted from the radiation source 803 is irradiated to the radiation imaging device 801 after passing through a subject not shown. The radiation source 803 stops the emission of the radiation according to stop instructions from the exposure control unit 802.

The radiation imaging device 801 includes the radiation detector 100 according to any of the first to eleventh embodiments described above, a control unit 805 used to control the radiation detector 100, and a signal processing unit 806 used to process a signal output from the radiation detector.

For example, when a signal output from the radiation detector 100 is an analog signal, the signal processing unit

806 is able to A/D-convert the analog signal and output the converted signal to the computer 804 as radiation image data. Further, for example, the signal processing unit 806 may generate a stop signal used to stop the irradiation of radiation from the radiation source 803 on the basis of a signal output from the radiation detector 100. The stop signal is supplied to the exposure control unit 802 via the computer 804, and the exposure control unit 802 transmits stop instructions to the radiation source 803 in response to the stop signal.

The control unit 805 can be constituted by, for example, a PLD (Programmable Logic Device) such as an FPGA (Field Programmable Gate Array), an ASIC (Application Specific Integrated Circuit), a general-purpose computer in which a program is incorporated, or a combination of all or some of the foregoing components.

Further, the signal processing unit 806 is shown as being arranged in the control unit 805 or as a part of the function of the control unit 805 but is not limited to such a configuration. The control unit 805 and the signal processing unit 806 may be configured to be separated from each other. In addition, the signal processing unit 806 may be arranged separately from the radiation imaging device 801. For example, the computer 804 may have the function of the signal processing unit 806. Therefore, the signal processing unit 806 can be included in the radiation imaging system 800 as a signal processing device that processes a signal output from the radiation imaging device 801.

The computer 804 can perform the control of the radiation imaging device 801 and the exposure control unit 802 or perform processing to receive radiation image data from the radiation imaging device 801 and display the received data as a radiation image. Further, the computer 804 can function as an input unit used by a user to input conditions for capturing a radiation image.

As an example of a sequence, the exposure control unit 802 having an exposure switch gives exposure instructions to the radiation source 803 and gives start notification notifying the start of the emission of radiation to the computer 804 when the exposure switch is turned on by a user. The computer 804 having received the start notification notifies the control unit 805 of the radiation imaging device 801 of the start of irradiating radiation in response to the start notification. According to this operation, the control unit 805 causes a signal corresponding to the incident radiation to be generated in the radiation detector 100.

In the radiation imaging device and the radiation imaging system using the radiation imaging device of the present embodiment, an excessive force applied to a semiconductor layer thin and weak in mechanical strength due to an imbalance in the thermal contraction of respective units may be effectively prevented even if the radiation detector is cooled during imaging. Therefore, the radiation imaging device that has excellent reliability and durability and is capable of obtaining a high-quality radiation image may be realized and put to practical use in various fields such as medical treatment and industry.

Thirteenth Embodiment

Figure 17:
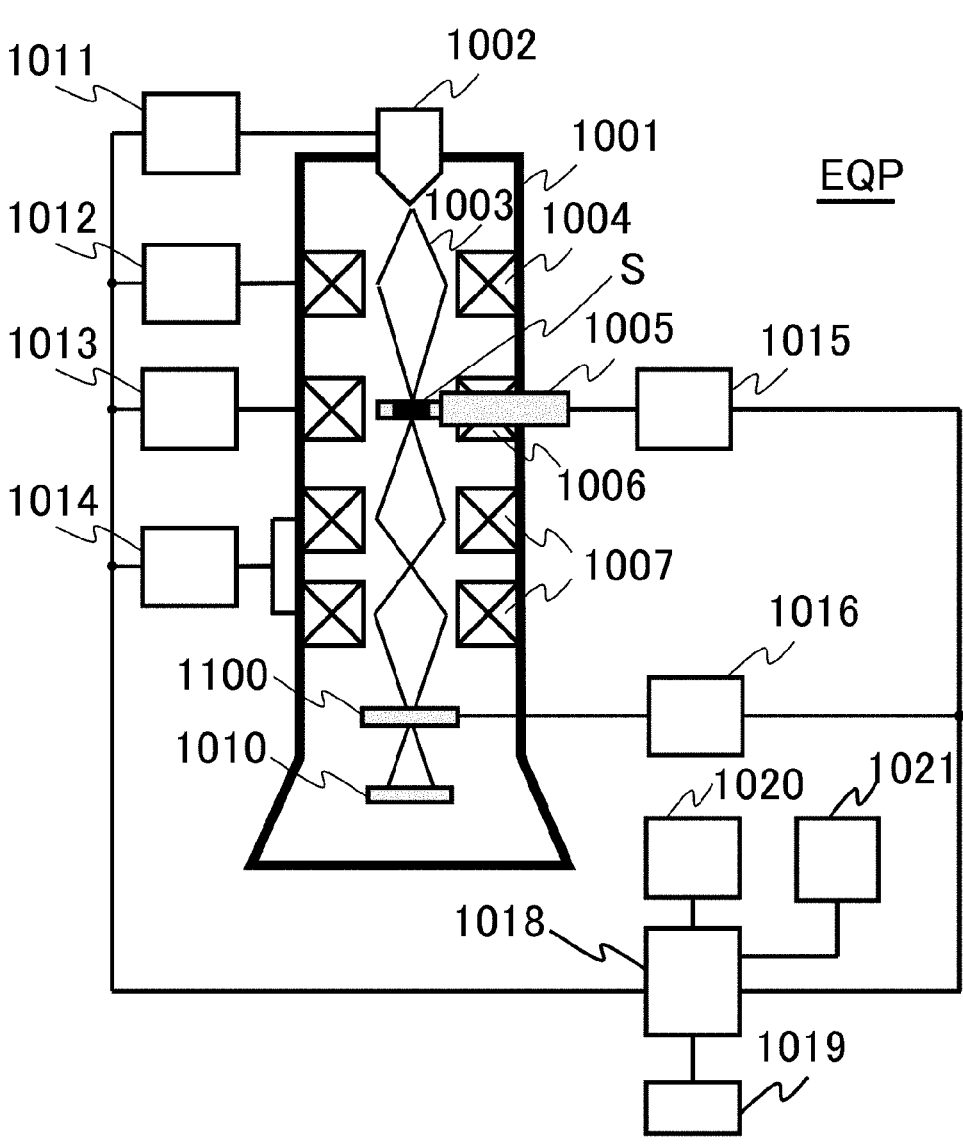
FIG. 17 is a schematic diagram for describing a radiation imaging system according to a thirteenth embodiment.

As a radiation imaging system in which the radiation detector according to any of the first to eleventh embodiments described above is incorporated, a transmission electron microscope (TEM) system will be described with reference to the schematic configuration diagram of FIG. 17. Equipment EQP serving as a transmission electron microscope has an electron ray source 1002 (electron gun), an irradiation lens 1004, a vacuum chamber 1001 (barrel), an objective lens 1006, an enlargement lens system 1007, and a radiation detector 1100.

An electron ray 1003 that is radiation emitted from the electron ray source 1002 (electron gun) serving as a radiation source is focused by the irradiation lens 1004 and irradiated to a sample S serving as an analysis target held by a sample holder. A space through which the electron ray 1003 passes is defined by the vacuum chamber 1001 (barrel) provided in the equipment EQP. The space is kept in a vacuum state.

The electron ray 1003 having passed through the sample S is enlarged by the objective lens 1006 and the enlargement lens system 1007 and formed into an image on the light-receiving surface of the radiation detector 1100. An electron optical system used to irradiate the sample S with the electron ray is called an irradiation optical system, and an electron optical system used to form the electron ray having passed through the sample S into an image on the light-receiving surface of the radiation detector 1100 is called an image forming optical system.

The electron ray source 1002 is controlled by an electron ray source control device 1011. The irradiation lens 1004 is controlled by an irradiation lens control device 1012. The objective lens 1006 is controlled by an objective lens control device 1013. The enlargement lens system 1007 is controlled by an enlargement lens system control device 1014. A control mechanism 1005 of the sample holder is controlled by a holder control device 1015 that controls the driving mechanism of the sample holder.

The electron ray 1003 having passed through the sample S is detected by the radiation detector 1100. An output signal from the radiation detector 1100 is processed by a signal processing device 1016 and an image processing device 1018 to generate an image signal. The generated image signal (transmission electron image) is displayed on an image display monitor 1020 and an analysis monitor 1021 serving as display devices.

In the transmission electron microscope (TEM) system of the present embodiment including the radiation detector according to any of the first to eleventh embodiments, an excessive force applied to a semiconductor layer thin and weak in mechanical strength due to an imbalance in the thermal contraction of respective units may be effectively prevented even if the radiation detector is cooled during imaging. Therefore, the transmission electron microscope (TEM) system that has excellent reliability and durability and is capable of obtaining a high-quality captured image may be realized.

Note that the electron microscope according to the embodiments is not limited to a transmission electron microscope (TEM) given as an example but may be, for example, a scanning electron microscope (SEM) or a scanning transmission electron microscope (STEM). Moreover, an electron microscope including a processing function such as ion beam milling and ion beam induced deposition (IBID) or a dual beam electron microscope such as an FIB-SEM including a focused ion beam (FIB) may be used as such.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-081757, filed on May 18, 2022, and Japanese Patent Application No. 2023-016012, filed on Feb. 6, 2023, which are hereby incorporated by reference herein in their entirety.

What is claimed is:

1. A radiation detector comprising:
a pixel array in which pixels each having a radiation detection element configured to convert radiation into charges and an amplification transistor configured to amplify a signal from the radiation detection element and output the amplified signal are arrayed in a matrix shape; and
signal wiring provided for each pixel column,
wherein the signal wiring does not overlap an active layer, in which the amplification transistor is arranged, in a plan view,
wherein the signal wiring includes at least two signal wiring lines arranged with respect to one pixel column,
wherein the pixels have power supply wiring arranged parallel to the signal wiring line,
wherein an interval between an adjacent signal wiring line is smaller than an interval between the signal wiring line, which is adjacent to the power supply wiring, and the power supply wiring,
wherein the pixels include a reset transistor, and
wherein the power supply wiring includes first power supply wiring that supplies a drain potential of the amplification transistor, second power supply wiring that supplies a well potential, and third power supply wiring that supplies a drain potential of the reset transistor.

2. The radiation detector according to claim 1, wherein the active layer in which the amplification transistor is arranged is a channel region of the amplification transistor.

3. The radiation detector according to claim 1, wherein the active layer in which the amplification transistor is arranged is a diffusion region of the amplification transistor.

4. The radiation detector according to claim 1, wherein the signal wiring lines are formed in a same layer as wiring that supplies a power supply voltage to the amplification transistor, and wherein the signal wiring lines are arranged to be adjacent to each other.

5. The radiation detector according to claim 1, wherein connection wiring that is provided for each amplification transistor and that is orthogonal to a corresponding one of the signal wiring lines is provided,
wherein the signal wiring lines and the connection wiring are formed in different layers and electrically connected to each other via a via hole, and
wherein plane layouts of the pixels are substantially same in shape except for the via hole.

6. The radiation detector according to claim 5, wherein each intersection between the signal wiring and the connection wiring, an overlapped region has substantially a same area.

7. The radiation detector according to claim 1, wherein the second power supply wiring is arranged between the first power supply wiring and the third power supply wiring.

8. The radiation detector according to claim 1, wherein the third power supply wiring is arranged between the first power supply wiring and the second power supply wiring.

9. The radiation detector according to claim 1, wherein the first power supply wiring, the second power supply wiring, and the third power supply wiring are arranged at an upper part of a region in which the amplification transistor is arranged.

10. The radiation detector according to claim 1, wherein the signal wiring is arranged at an upper part of a region in which the radiation detection element is arranged, and
wherein the signal wiring includes at least three signal wiring lines per pixel column.

11. The radiation detector according to claim 1, wherein the radiation detector is of a surface irradiation type.

12. A radiation imaging system comprising:
the radiation detector according to claim 1; and
a signal processing unit that processes a signal output from the radiation detector.

13. A radiation imaging system comprising:
the radiation detector according to claim 1; and
a radiation source.

* * * * *